(12) United States Patent
Ostermayr et al.

(10) Patent No.: US 7,816,198 B2
(45) Date of Patent: Oct. 19, 2010

(54) SEMICONDUCTOR DEVICE AND METHOD FOR MANUFACTURING THE SAME

(75) Inventors: Martin Ostermayr, Feldkirchen (DE); Winfried Kamp, Munich (DE); Anton Huber, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 564 days.

(21) Appl. No.: 11/775,504

(22) Filed: Jul. 10, 2007

(65) Prior Publication Data

US 2009/0014806 A1    Jan. 15, 2009

(51) Int. Cl.
*H01L 29/94*    (2006.01)
(52) U.S. Cl. ............... 438/199; 257/369; 257/E21.632; 257/E29.345
(58) Field of Classification Search .......... 257/255, 257/367, 369, E21.632, E29.345; 438/199, 438/197, 455
See application file for complete search history.

(56) References Cited

U.S. PATENT DOCUMENTS

| 5,729,045 | A | 3/1998 | Buynoski | |
| 7,312,485 | B2 * | 12/2007 | Armstrong et al. | 257/255 |
| 2004/0051143 | A1 | 3/2004 | Oh et al. | |
| 2004/0217448 | A1 | 11/2004 | Kumagai et al. | |
| 2005/0001290 | A1 | 1/2005 | Chan et al. | |
| 2005/0139929 | A1 * | 6/2005 | Rost | 257/369 |
| 2006/0202277 | A1 | 9/2006 | Hierlemann et al. | |
| 2006/0237785 | A1 * | 10/2006 | Ieong et al. | 257/338 |
| 2008/0308847 | A1 * | 12/2008 | Xiong et al. | 257/255 |

* cited by examiner

*Primary Examiner*—Thomas L Dickey
*Assistant Examiner*—Fazli Erdem
(74) *Attorney, Agent, or Firm*—Banner & Witcoff, Ltd.

(57) ABSTRACT

A semiconductor device and method of manufacturing thereof. The semiconductor device has at least one NMOS device and at least one PMOS device provided on a substrate. An electron channel of the NMOS device is aligned with a first direction. A hole channel of the PMOS device is aligned with a different second direction that forms an acute angle with respect to the first direction.

17 Claims, 33 Drawing Sheets

SEMICONDUCTOR DEVICE AND METHOD FOR MANUFACTURING THE SAME

BACKGROUND

According to planar complementary metal oxide semiconductor (complementary MOS, or CMOS) technology, field effect transistors of complementary carrier type are formed on a semiconductor substrate, such as a bulk silicon substrate having {100}-type surface orientation. In the process of manufacturing such a semiconductor device, electron channels and hole channels are formed by patterning functional layers formed on the semiconductor substrate, such as layers of doped semiconductor material, metal layers, or oxide layers. The patterned structures are typically aligned with specific crystal directions of the semiconductor substrate, as indicated by a flat or a notch on the periphery of a semiconductor wafer.

When reducing the lateral feature size of semiconductor structures, specifically in the range of sub-quarter micron technologies, the device properties increasingly depend on stress conditions generated during the manufacturing process. This may cause unbalanced modifications in the properties of negative-channel MOS (NMOS) devices and of positive-channel MOS (PMOS) devices.

SUMMARY

Various embodiments of a semiconductor device and method of manufacturing thereof are described. The semiconductor device may have at least one NMOS device and at least one PMOS device provided on a substrate. An electron channel of the NMOS device may be aligned with a first direction, and a hole channel of the PMOS device may be aligned with a different second direction. The second direction may form an acute angle with respect to the first direction.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein.

DETAILED DESCRIPTION

Figure 1:
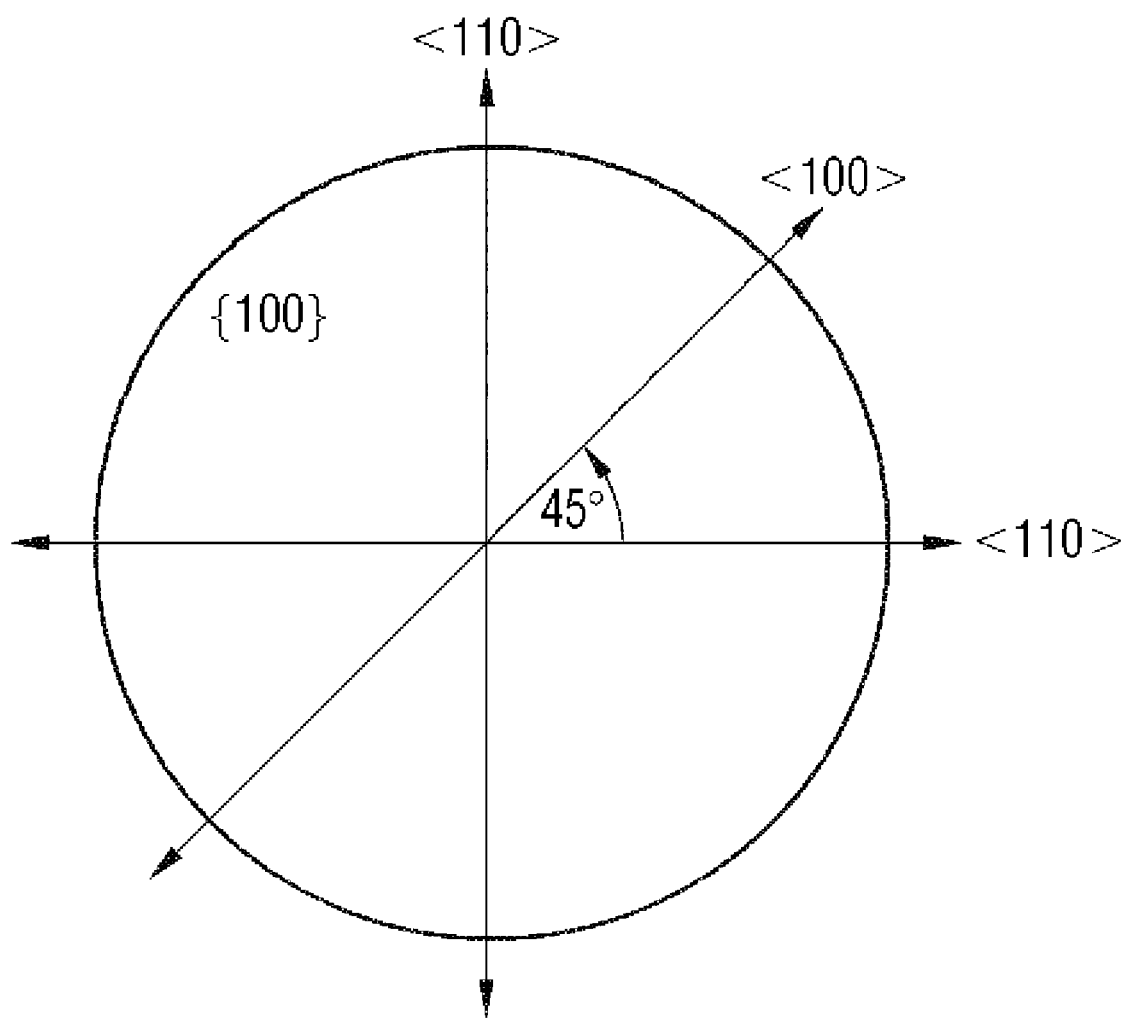
FIG. 1 schematically represents an illustrative semiconductor substrate as used in a method of manufacturing a semiconductor device in accordance with various aspects as described herein.

The various aspects summarized previously may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled" or "connected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements. Furthermore, it should be appreciated that functional blocks or units shown in the drawings may be implemented as separate circuits in some embodiments, but may also be fully or partially implemented in a common circuit in other embodiments.

In the following, various illustrative embodiments will be described with reference to the accompanying drawings. It is to be understood that the drawings are intended to be merely illustrative and that the illustrated structures are not to scale. The embodiments described hereinafter are based on a method of manufacturing semiconductor devices using planar complementary metal-oxide semiconductor (CMOS) technology. According to planar CMOS technology, field-effect transistors (FETs) may be formed on a semiconductor substrate, e.g. a bulk silicon substrate having {100}-surface orientation. The field effect transistor may have a gate oxide or other insulating layer, a gate conductor formed on the gate oxide layer, spacers formed beside the gate on the gate oxide layer, and doped source regions and drain regions arranged on respective sides of the gate. The gate oxide electrically isolates a channel formed between the source region and the drain region from the gate conductor.

Also according to planar CMOS technology, negative-channel metal-oxide semiconductor (NMOS) devices and positive-channel metal-oxide semiconductor (PMOS) devices may be formed on the semiconductor substrate. In an NMOS device, an electron channel is formed between the source region and the drain region. In a PMOS device, a hole channel is formed between the source region and the drain region. The doped semiconductor material of the source region, the drain region and the channel extending between the source region and the drain region may be referred to as an "active area". In planar CMOS technology, active areas of NMOS devices and active regions of PMOS devices are separated from each other. The separation may be formed using, e.g., shallow trench isolations or local oxidation of silicon (LOCOS).

The semiconductor devices having the above-mentioned components may be formed by applying a sequence of lithographic patterning steps to material layers deposited on the semiconductor substrate.

FIG. 1 schematically represents an illustrative embodiment of a semiconductor substrate (e.g., which may be in the form of a semiconductor wafer during the manufacturing process) as used in a method of manufacturing a semiconductor device according to an embodiment of the invention. The wafer in this example has a {100}-type surface orientation. As illustrated, in the plane of the {100}-type surface, there are <110>-type and <100>-type crystal directions. The <100>-type direction extends at an angle of 45 degrees with respect to the <110>-type direction.

Due to the symmetry of the semiconductor crystal, there exist families of equivalent directions and planes. Accordingly, as used herein, an {100}-type surface or plane refers to the (100)-plane and all equivalent planes, e.g. the (010)-plane and the (001)-plane. Correspondingly, the <100>-type direction refers to the [100]-direction and to all equivalent directions, e.g. the [100]-direction, the [010]-direction and the [001]-direction. In the case of the {110}-type direction, equivalent directions are the [110]-direction, the [011]-direction, the [101]-direction, the [−1 −1 0]-direction, the [0 −1 −1]-direction, the [−1 0 −1]-direction, the [−1 1 0]-direction, the [0 −1 1]-direction and the [1 0 −1]-direction.

In the following description of various illustrative embodiments, it will be assumed unless explicitly stated otherwise that the semiconductor devices are formed on an {100}-type surface of a bulk silicon wafer. The bulk silicon material may be p-type. However, according to other embodiments, other types of semiconductor substrates may be used, such as bulk silicon having {110}-type surface orientation or n-type material.

In the process of manufacturing semiconductor devices, a reference crystal direction within the plane of the semiconductor substrate may be indicated by a notch or flat region on the edge of the wafer. By aligning the reference crystal direction with a reference direction on the masks used in the lithographic patterning process, the structures and patterns of the semiconductor devices may be oriented with respect to the reference crystal direction.

Figure 2:
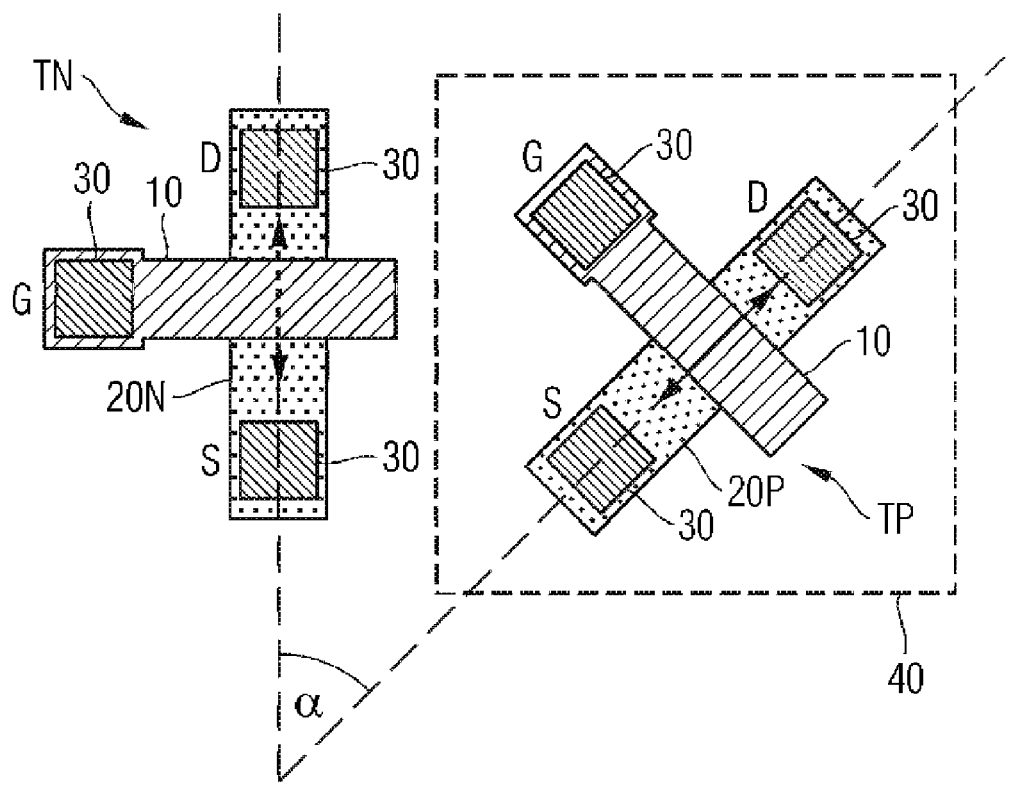
FIG. 2 schematically represents an illustrative semiconductor device according to various aspects as described herein.

FIG. 2 schematically represents an illustrative embodiment of a semiconductor device. The semiconductor device in this example includes an NMOS device TN and a PMOS device TP. The NMOS device TN and the PMOS device TP in this example are field effect transistors having a source region S, a drain region D and a gate electrode G. An active area 20N, 20P extends between the source region S and the drain region D. A gate conductor 10 extends over a channel formed between the source region S and the drain region D. The gate conductor 10 is electrically isolated from the active area 20N, 20P and the channel formed therein by means of a gate oxide or other insulating layer (not illustrated). The devices TN and TP further have contacts 30, which may be vias formed with respect to a conductive layer. The active area 20P of the PMOS device TP is formed in an n-well 40 provided in the p-type semiconductor substrate. In other embodiments, the semiconductor substrate may be n-type, and the active area 20N of the NMOS device TN may be formed in a p-well. For forming the above-mentioned structures, various individually known processing steps may be employed such as deposition of material, diffusion, implantation, oxidation, etching, etc.

In FIG. 2, the direction of an electron channel of the NMOS device TN is illustrated by means of a dotted arrow. The direction of the hole channel of the PMOS device TP is illustrated by means of a solid arrow. As illustrated, an acute angle α is formed between the direction of the electron channel of the NMOS device TN and the direction of the hole channel of the PMOS device TP. As used herein, the angle α being acute means that 0 degrees<α<90 degrees. Accordingly, the electron channel of the NMOS device TN and the hole channel of the PMOS device TP are not aligned with the same crystal direction or with equivalent crystal directions. According to some embodiments, the angle α is between 30 degrees and 60 degrees, inclusive. For example, the angle α may be approximately 45 degrees. It is to be understood that the polarity of electrical current through the electron channel and hole channel will depend on the potentials applied to the source region S and the drain region D. Accordingly, double-headed arrows are used for illustrating the directions of the electron channel and the hole channel.

Due to the acute angle α formed between the electron channel of the NMOS device TN and the hole channel of the PMOS device TP, conductive properties of the channels may be individually tuned. For example, the electron channel may be aligned with a crystal direction providing a high electron mobility, and the hole channel may be aligned with a crystal direction providing a high hole mobility.

According to the illustrated embodiment, the relative orientation of the electron channel and the hole channel is obtained by means of a device layout providing a relative rotation of the active area 20N of the NMOS device TN with respect to the active area 20P of the PMOS device TP and a relative rotation of the gate conductor 10 of the NMOS device TN with respect to the gate conductor 10 of the PMOS device TP. In other embodiments, a similar effect may be achieved by a relative rotation of only the gate conductors 10 or of only the active areas 20N, 20P.

According to various embodiments, the NMOS device TN and the PMOS device TP may be formed on a rotated semiconductor substrate. That is to say, during manufacture of the semiconductor device, the semiconductor substrate is rotated with respect to the masks used for patterning in such a way that the directions of both the electron channel in the NMOS device TN and the hole channel in the PMOS device TP are set with respect to the reference crystal direction of the semiconductor substrate. According to various embodiments, the reference crystal direction of the semiconductor substrate may be a <110>-type and the electron channel of the NMOS device TN may be aligned with the reference crystal direction. In this case, the hole channel of the PMOS device TP is rotated relative to said reference crystal direction by the angle α, i.e. toward the <100>-type direction. In this way, the mobility of holes in the hole channel of the PMOS device TP may be increased.

In another embodiment, the reference crystal direction may be the <100>-type direction and the semiconductor substrate may be rotated such that the hole channel of the PMOS device TP is aligned with the reference crystal direction, thereby having the electron channel of the NMOS device TN aligned in a direction forming the angle α with respect to the reference crystal direction. In this case, the electron mobility in the electron channel of the NMOS device TN may be tuned.

Depending on the function of the NMOS device TN or of the PMOS device TP, either an increase or a decrease in mobility may be desirable. This may be achieved by selecting the angle α accordingly.

According to the embodiment as illustrated in FIG. 2, the orientation of the electron channel in the NMOS device TN and the orientation of the hole channel in the PMOS device TP may be selected independently.

The mobility of electrons in the electron channel of the NMOS device TN and the mobility of holes in the hole channel of the PMOS device TP may also depend on the stress applied to the material in the active area during (and remaining after) manufacture of the semiconductor device. That is to say, layers formed on the material of the active area may generate either tensile or compressive stress in a transverse, longitudinal or vertical direction with respect to the direction of the electron channel or of the hole channel. Correspondingly, the mobility in the channel may be increased or decreased. This may be further controlled by applying specific stress design techniques such as forming a tensile liner across the device or over the complete semiconductor substrate. It may further be desirable to use dual stress liners, which selectively apply stress according to the type of device. According to various embodiments, tensile stress may be applied to the channels of NMOS devices and compressive stress may be applied to the channels of PMOS devices.

Accordingly, various embodiments may further provide for the ability to select the angle α depending on the stress technique used in the process of manufacturing the semiconductor device, or vice-versa.

In the following, specific types of semiconductor devices will be described by way of example, in which the above-mentioned concepts of aligning an electron channel of an NMOS device in a first direction and aligning a hole channel of a PMOS device in a second direction forming the angle α with respect to the first direction are applied. It is to be understood that the illustrated circuit and layout structures may form only a part of the completed semiconductor device, and that the completed semiconductor device may include further circuits of the same type or of a different type. Moreover, for the sake of clarity, the illustrations generally do not show conductive layers, e.g. metal layers, for establishing connections between different NMOS and PMOS transistors so as to implement a specific circuit structure. However, the configurations of such conductive connections will be known and understood by one of ordinary skill in the art reading this description.

Figure 3:
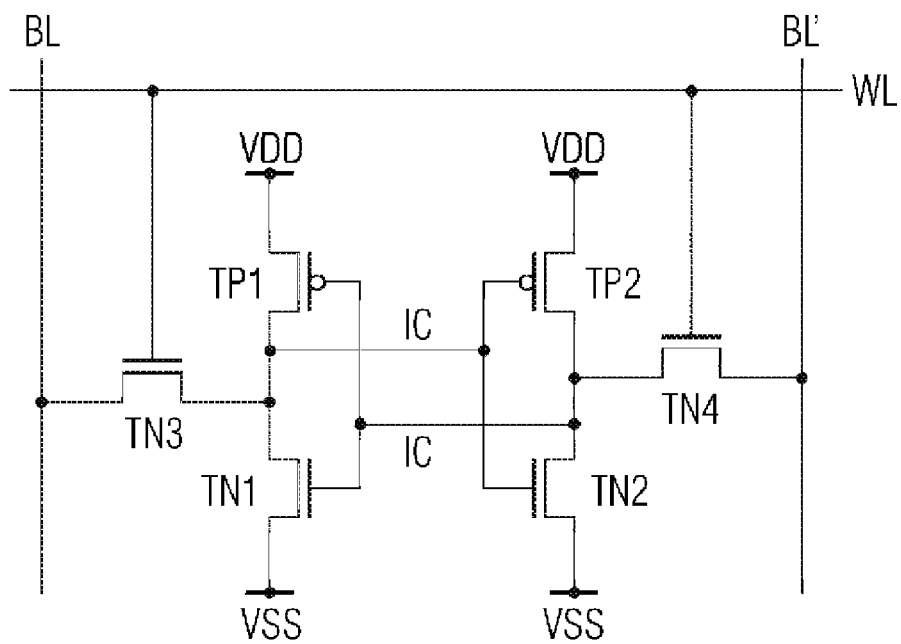
FIG. 3 is a schematic circuit diagram of an illustrative SRAM device according to various aspects as described herein.

FIG. 3 schematically represents a circuit diagram of an illustrative embodiment of an static random access memory (SRAM) cell as used in a semiconductor device. The SRAM in this example cell is implemented in CMOS technology and includes complementary NMOS devices and PMOS devices. In particular, the SRAM cell includes a first NMOS transistor TN1 and a first PMOS transistor TP1 connected in series between a low supply voltage VSS and a high supply voltage VDD. Gates of the NMOS transistor TN1 and of the PMOS transistor TP1 are coupled to each other so as to form an inverter. Further, a second NMOS transistor TN2 and a second PMOS transistor TP2 are connected in series between the low supply voltage VSS and the high supply voltage VDD, having their gates coupled to each other so as to form a second inverter. A circuit node between the first NMOS transistor TN1 and the first PMOS transistor TP1 is coupled to the gates of the second NMOS transistor TN2 and the second PMOS transistor TP2. Similarly, a circuit node between the second NMOS transistor TN2 and the second PMOS transistor TP2 is coupled to the gates of the first NMOS transistor TN1 and first PMOS transistor TP2. This structure corresponds to a bistable circuit in which either the circuit node between the NMOS transistor and the PMOS transistor of the first inverter or the circuit node between the NMOS transistor and the PMOS transistor of the second inverter can assume a high potential, whereas the other circuit node assumes a low potential.

According to the illustrated circuit diagram, the state of the bistable circuit may be changed by means of a third NMOS transistor TN3 and a fourth NMOS transistor TN4 connected between said circuit node of the first inverter and a bit line BL and said circuit node of the second inverter and a complementary bit line BL', respectively. Gates of the third NMOS transistor TN3 and of the fourth NMOS transistor TN4 are coupled to a word line WL. Accordingly, the state of the bistable circuit may be changed by charging the bit line BL and the complementary bit line BL' to a corresponding value and activating the third NMOS transistor TN3 and the fourth NMOS transistor TN4 via the wordline WL. Further, the NMOS transistors TN3, TN4 may be used to sense the state of the bistable circuit via the bit line and the complementary bit line BL'.

An SRAM semiconductor device may include a plurality of the cells such as illustrated in FIG. 3, which are arranged to form an array. Further, an SRAM semiconductor device may also comprise other circuitry such as sensing amplifiers, control logic etc.

Figure 4:
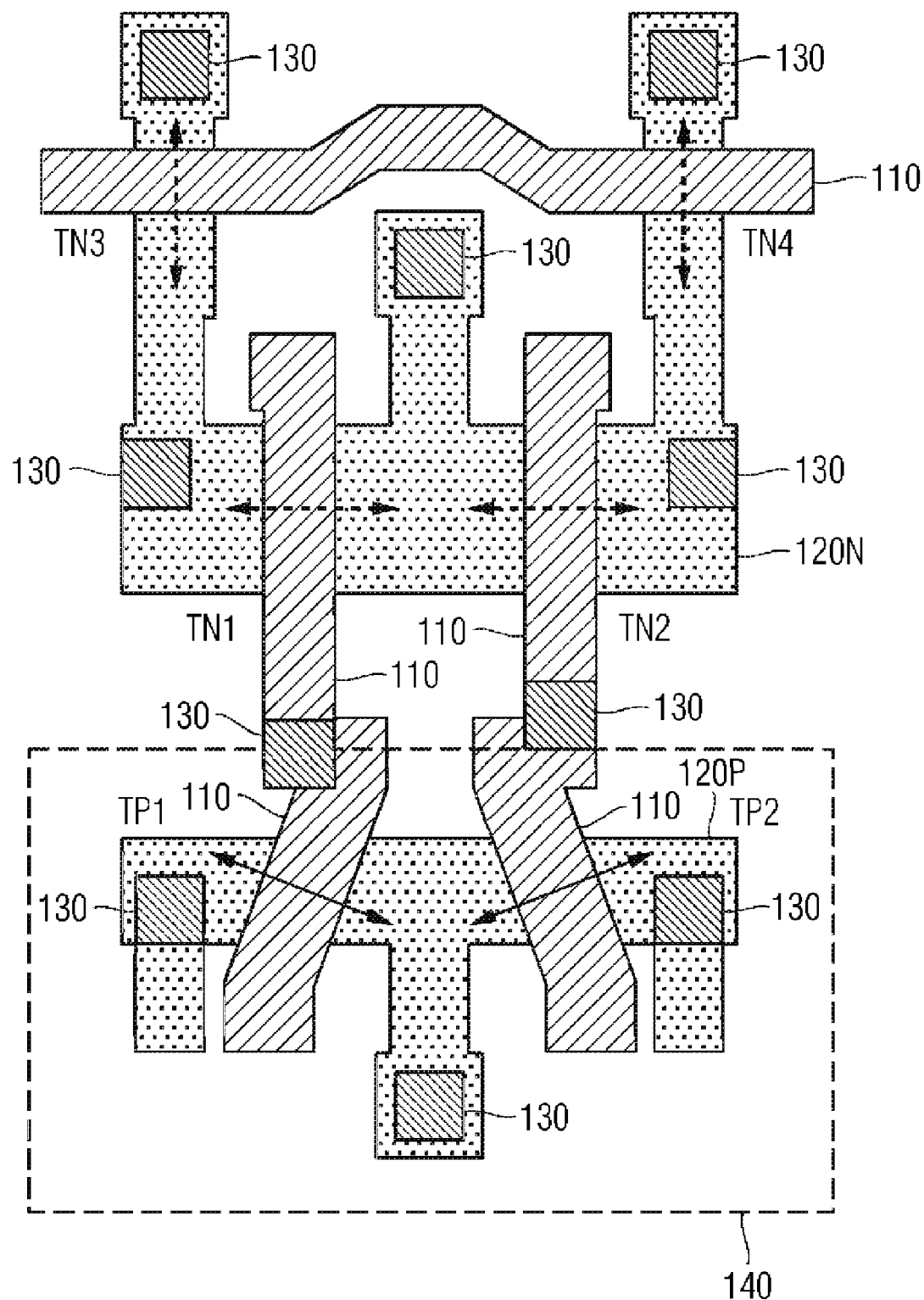
FIGS. 4-22 schematically represent various device layouts of an SRAM cell in a semiconductor device according to various illustrative embodiments.

FIG. 4 schematically represents an illustrative device layout of the SRAM cell corresponding to the circuit diagram of FIG. 3. According to the device layout, a first active area 120N is provided, in which the NMOS transistors TN1, TN2, TN3 and TN4 are formed. A second active area 120P is provided, in which the PMOS transistors TP1 and TP2 are formed. The circuit is connected via a plurality of contacts 130. The first active region 120N and the second active area 120P are separated from each other so as to electrically isolate the NMOS transistors and PMOS transistors. The active region 120P of the PMOS transistors is provided an n-well 140 of the p-type semiconductor substrate. According to other embodiments, the first active region 120N of the NMOS transistors may be provided in a p-well of an n-type semiconductor substrate.

The orientation of the electron channels of the NMOS devices TN1, TN2, TN3, TN4 and the orientations of the hole channels of the PMOS transistors TP1, TP2 are denoted as explained with reference to FIG. 2. It will be assumed that the vertical direction in the illustration of FIG. 4 corresponds to a <110>-type reference direction on a {100}-type surface of the semiconductor substrate. Accordingly, also the vertical direction in the figure will correspond to a <110>-type direction.

In FIG. 4, gate conductors of the transistors TP1, TP2, TN1, TN2, TN3, TN4 have been designated with 110.

As illustrated in FIG. 4, a channel forming portion of the gate conductor 110 of the first PMOS transistor TP1 extends at an acute angle with respect to the vertical and horizontal directions, from the upper right to the lower left. Similarly, a channel forming portion of the gate conductor 110 of the second PMOS transistor TP2 extends at an acute angle with respect to the vertical and horizontal directions, from the upper left to the lower right. Accordingly, the hole channels formed under channel forming portions of the gate conductors 110 of the PMOS transistors TP1 and TP2 are each aligned in a direction which deviates from the <110>-type reference crystal direction of the semiconductor substrate toward a <100>-type direction.

As further illustrated, channel forming portions of the gate conductors 110 of the first NMOS transistor TN1 and of the second NMOS transistor TN2 extend along the vertical direction, perpendicular to a channel forming portion of the active area 120N located beneath the gate conductors 110. Accordingly, the direction of the electron channels of the NMOS transistors TN1, TN2 will be substantially along the horizontal direction of the figure, corresponding to a <110>-type direction.

The NMOS transistors TN3, TN4 have a common gate conductor 110, which corresponds to the word line WL as illustrated in FIG. 3. Channel forming portions of the gate conductor 110 extend along the horizontal direction, perpendicular to the channel forming portion of the active area 120N of the transistors TN3, TN4. Accordingly, the direction of the electron channel of the NMOS transistors TN3, TN4 will be along the vertical direction of the figure, corresponding to a <110>-type direction.

A channel forming portion of the active area 120N of the third NMOS transistor TN3 and of the fourth NMOS transistor TN4, which have the function of access transistors, may be formed with a smaller width than the channel forming portion of the active area 120N in the first NMOS transistor TN1 and the second NMOS transistor TN2, thereby reducing a leakage current.

Accordingly, as illustrated, the directions of the hole channels of the PMOS transistors TP1, TP2 in each case form an acute angle with respect to the direction of the electron channels of the NMOS transistors TN1, TN2, TN3, TN4. This is achieved by rotating the channel forming portions of the gate conductors 110 of the PMOS transistors TP1, TP2, relative to the channel forming portions of the gate conductors 110 of the NMOS transistors TN1, TN2, TN3, TN4. The channel forming portions of the first active area 120N and of the second active area 120P are aligned with the vertical direction or the horizontal direction, i.e. with the <110>-type direction.

Figure 5:
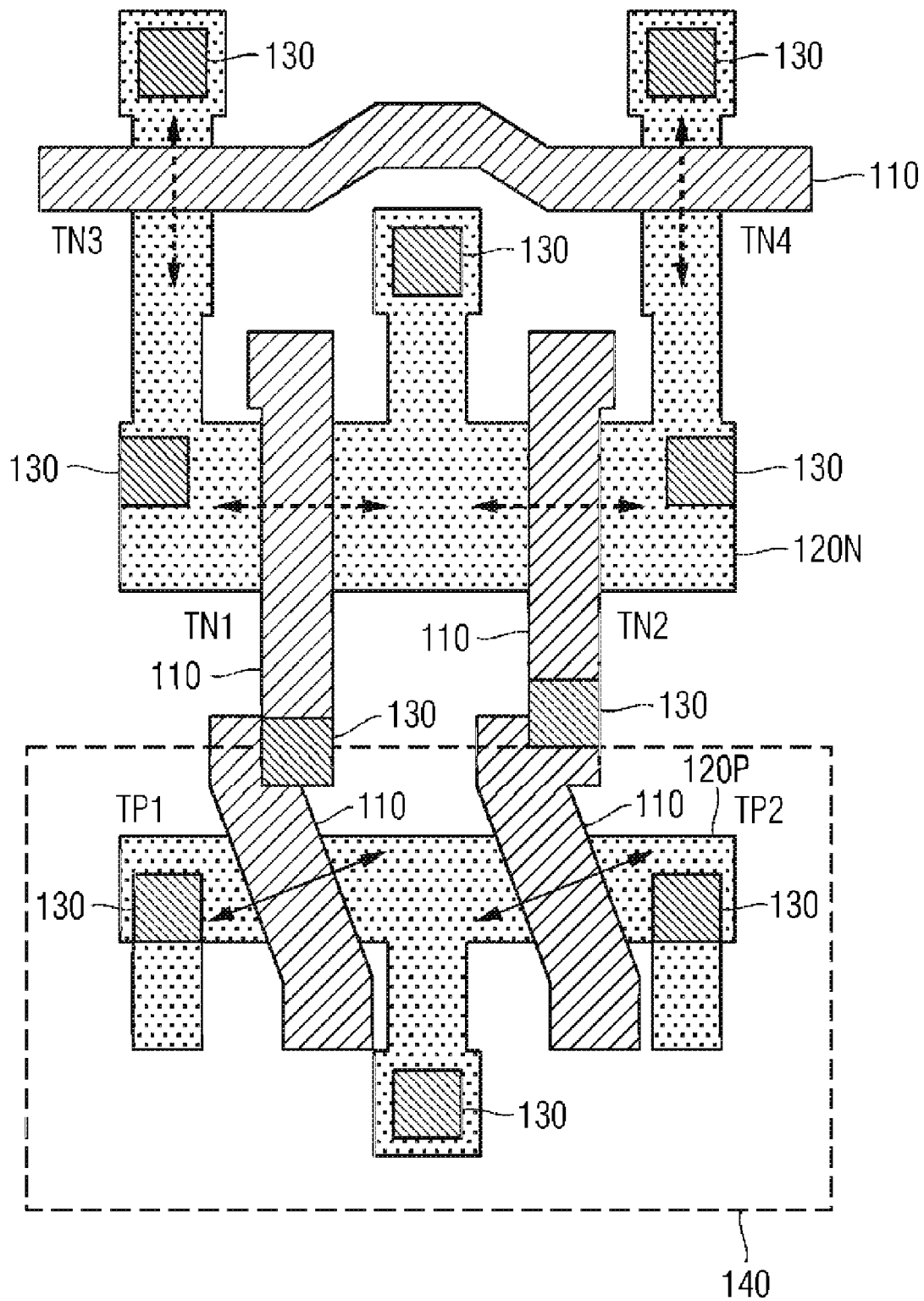

FIG. 5 schematically represents another illustrative device layout of an SRAM cell in a semiconductor device. The device layout of FIG. 5 generally corresponds to that of FIG. 4, and similar components have been designated with the same reference signs. In the following, only the differences as compared to the device layout of FIG. 4 will be explained.

As compared to FIG. 4, the device layout of FIG. 5 has the gate conductors 110 of the first PMOS transistor TP1 and of the second PMOS transistor TP2 arranged in such a way that channel forming portions thereof both extend in parallel to each other at the same angle with respect to the vertical direction. Accordingly, also the direction of the hole channels formed underneath the gate conductors 110 of the PMOS transistors TP1, TP2 extends at the same acute angle with respect to the direction of the electron channels of the NMOS transistors TN1, TN2, TN3, TN4.

Figure 6:
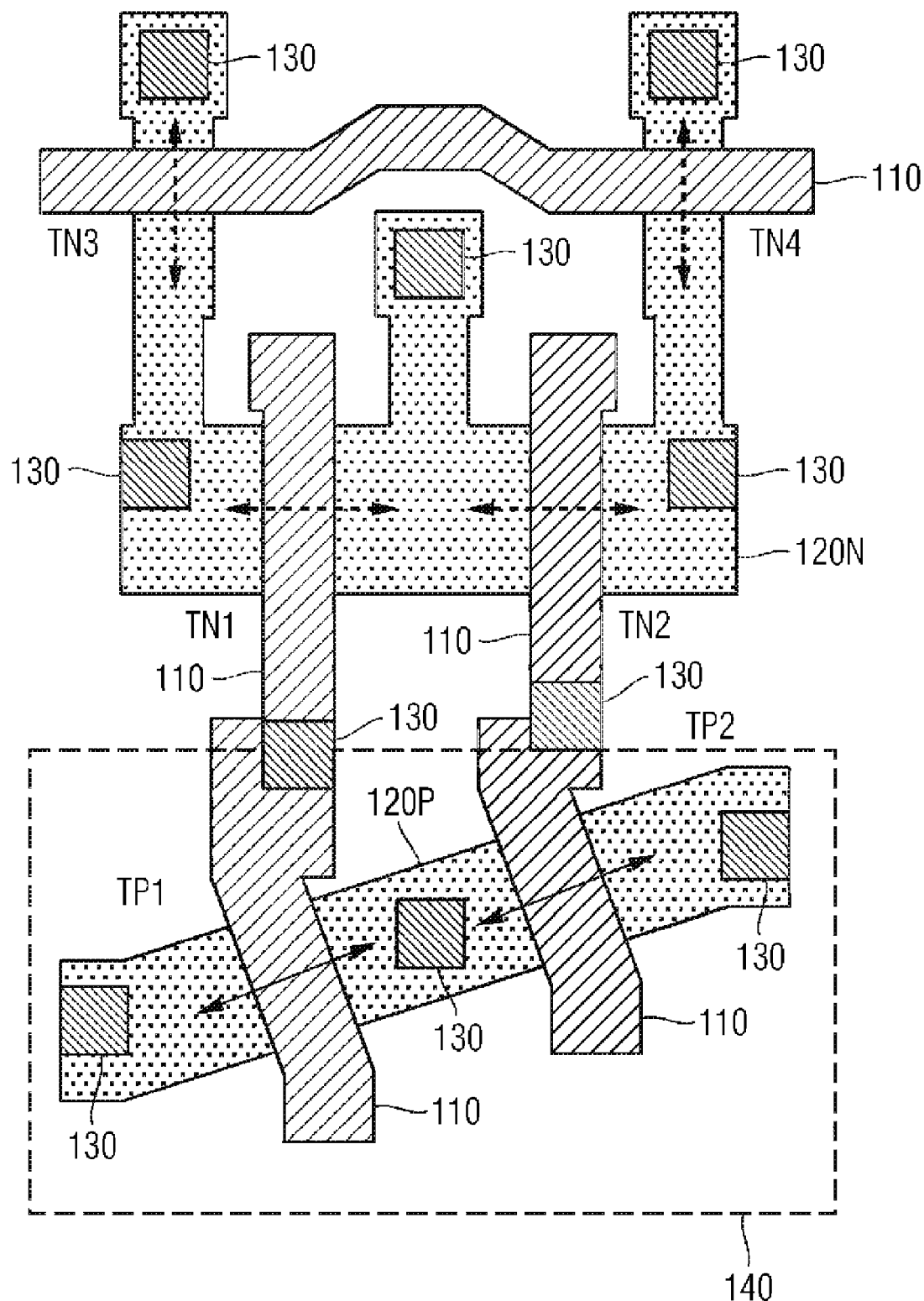

FIG. 6 schematically represents another illustrative device layout of an SRAM cell in a semiconductor device. The device layout of FIG. 6 generally corresponds to that of FIG. 5, and similar components have been designated with the same reference signs. In the following, only the differences as compared to the device layout of FIG. 5 will be explained.

As compared to the device layout of FIG. 5, which has the channel forming portions of the active area 120P arranged so as to extend along the vertical direction, the device layout of FIG. 6 has the channel forming portions of the active area 120P extending so as to form an acute angle with respect to the vertical direction. On the one hand, this helps to align the direction of the hole channels with the desired direction. On the other hand, this also modifies the stress conditions in the channel forming portions of the active area 120P, thereby providing a further degree of freedom to control the mobility of the hole channel.

Figure 7:
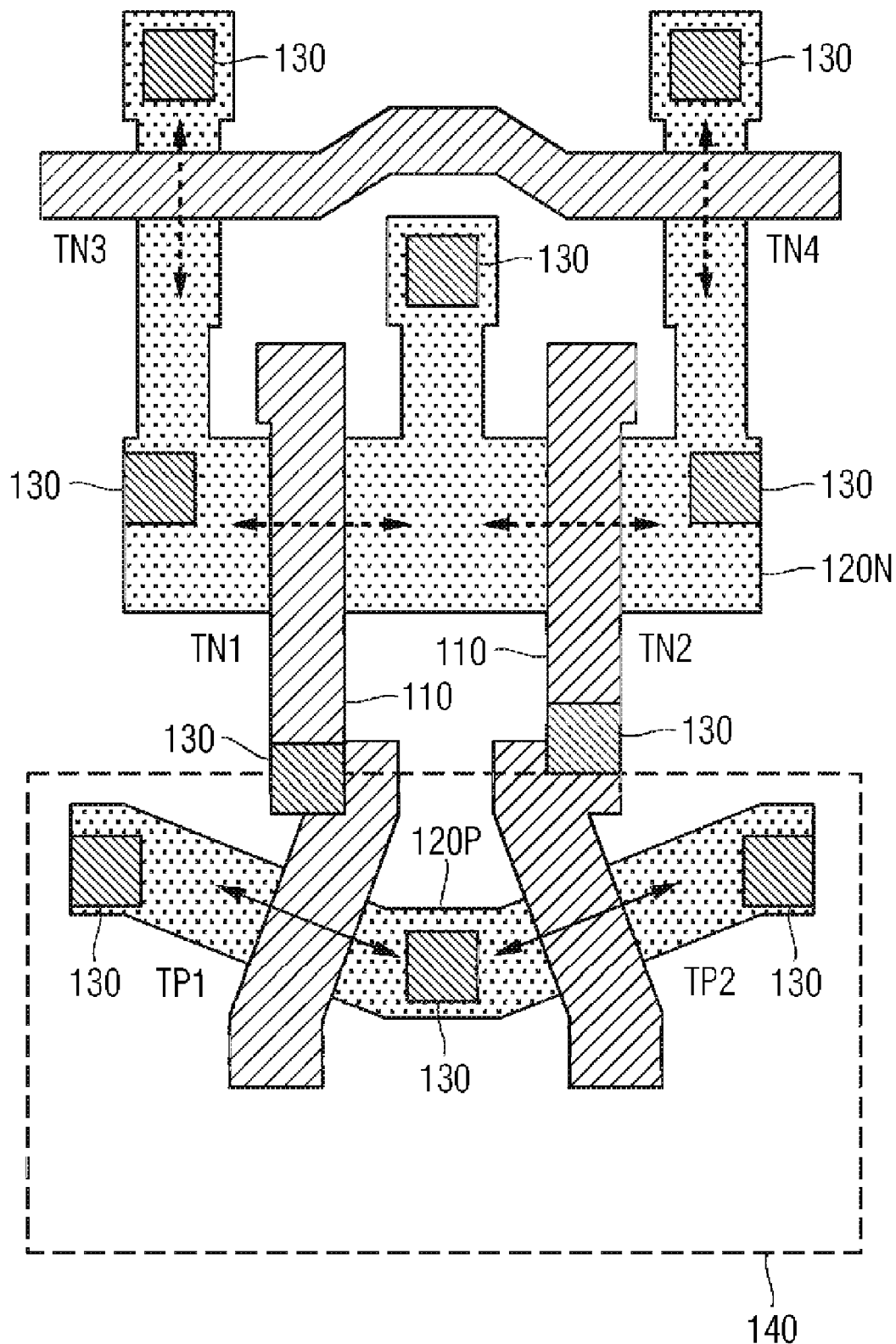

FIG. 7 schematically represents another illustrative device layout of an SRAM cell in a semiconductor device. The device layout generally corresponds to that of FIG. 4, and similar components have been designated with the same reference signs. In the following, only the differences as compared to the device layout of FIG. 4 will be explained.

As compared to FIG. 4, in which channel forming portions of the active area 120P are arranged so as to extend along the vertical direction, the device layout of FIG. 7 has channel forming portions of the active area 120P arranged so as to extend at an acute angle with respect to the vertical and horizontal directions. In particular, a channel forming portion of the active area 120P in the first PMOS transistor TP1 extends from the lower right to the upper left, and a channel forming portion of the active area 120P in the second PMOS transistor TP2 extends from the lower left to the upper right.

Figure 8:
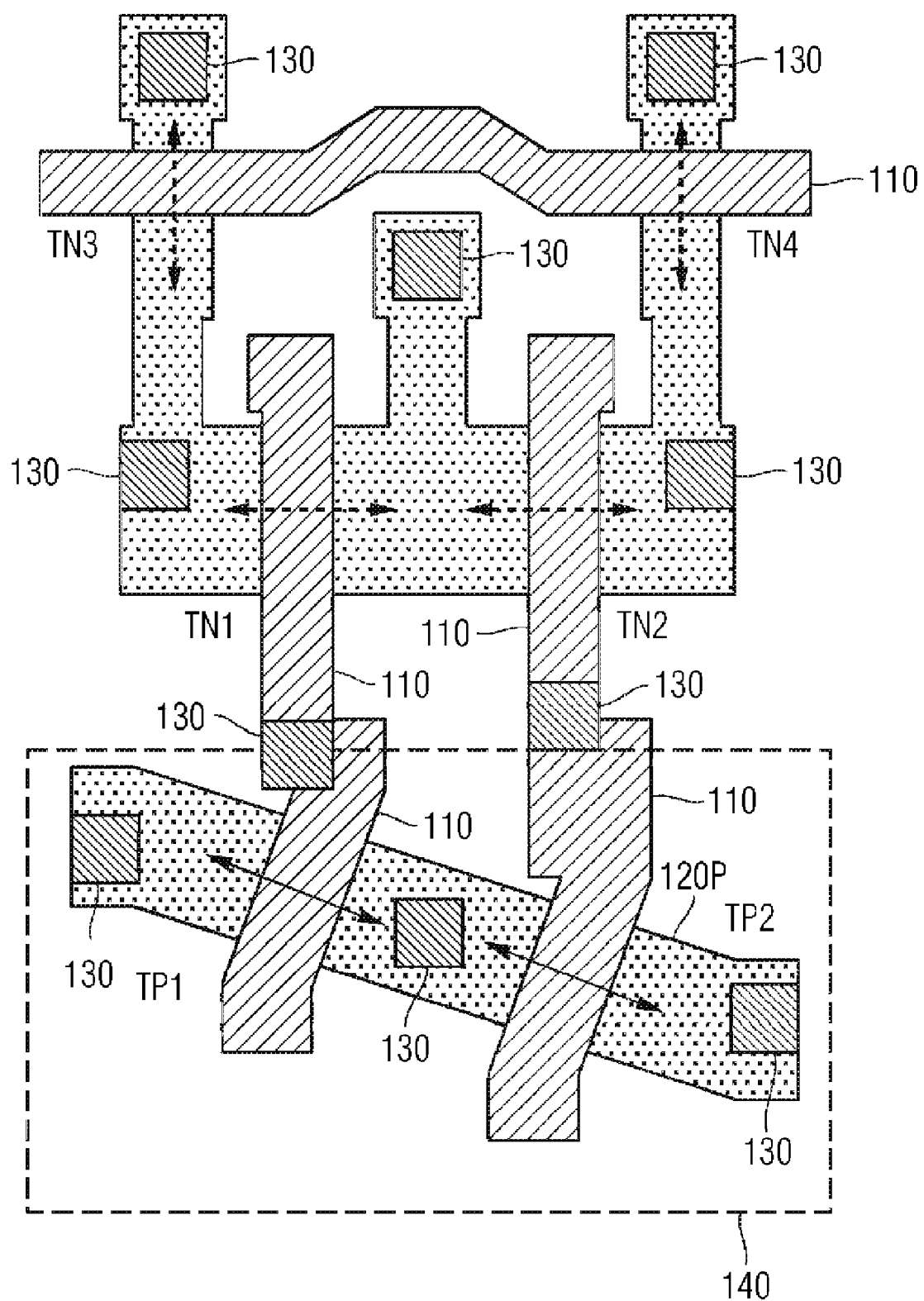

FIG. 8 schematically represents another illustrative device layout of an SRAM cell in a semiconductor device. The device layout of FIG. 8 generally corresponds to that of FIG. 6. In the following, only the differences as compared to the device layout of FIG. 6 will be explained.

As compared to the device layout of FIG. 6, which has channel forming portions of the active area 120P in the PMOS transistors TP1, TP2 extending from the lower left to the upper right, the device layout of FIG. 8 has channel forming portions of the active area 120P in the first PMOS transistor TP1 and the second PMOS transistor TP2 extending from the upper left to the lower right.

Figure 9:
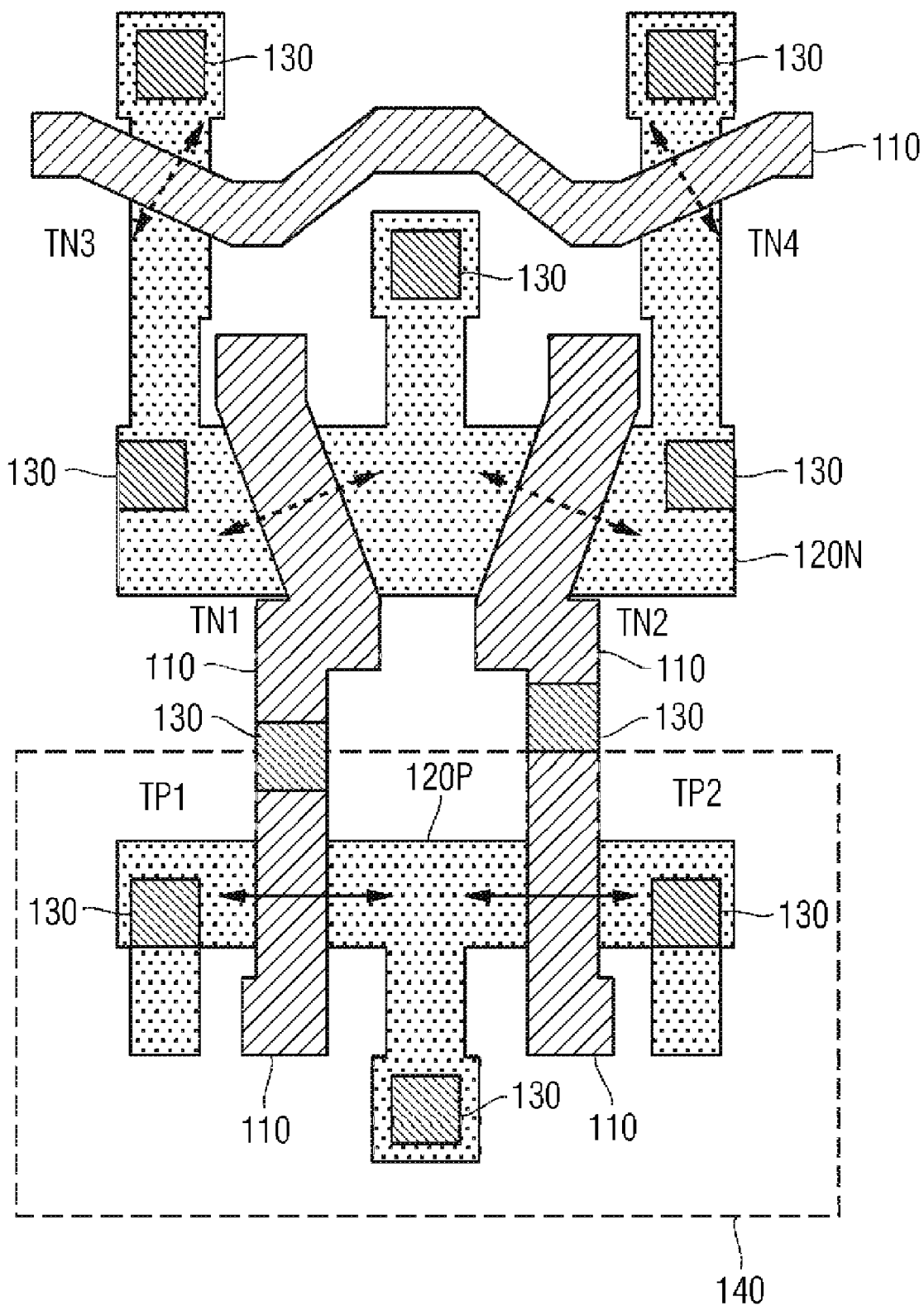

FIG. 9 schematically represents another illustrative device layout of an SRAM cell in a semiconductor device. The device layout generally corresponds to that of FIG. 4 and similar components have been designated with the same reference signs. In the following, only the differences has been compared to the device layout of FIG. 4 will be explained.

As compared to the device layout of FIG. 4, which has the electron channels in the NMOS transistors TN1, TN2, TN3, TN4 aligned with the vertical direction or the horizontal direction and the direction of the hole channels in the PMOS transistors TP1, TP2 arranged so as to extend at an acute angle with respect to the direction of the electron channels, the device layout according to FIG. 9 provides hole channels which are arranged along the vertical direction, whereas the electron channels of the NMOS transistors TN1, TN2, TN3, TN4 each form an acute angle with respect to the horizontal and vertical directions, and thereby also with respect to the direction of the hole channels in the PMOS transistors TP1, TP2. The device layout according to FIG. 9 may be used with the same substrate rotation as the device layout of FIG. 4, i.e. with the vertical direction of the figure corresponding to the <110>-type direction. However, the device layout of FIG. 9 may also be used with a substrate rotation of 45 degrees with respect to that as used in FIG. 4. In the latter case, the horizontal and vertical directions of the figure correspond to <100>-type directions. In this case, the hole channels of the PMOS transistors TP1, TP2 are aligned with the <100>-type direction, whereas the directions of the electron channels of the NMOS transistors TN1, TN2, TN3, TN4 are rotated toward a <110>-type direction, thereby potentially improving the mobility in both the hole channels and the electron channels.

In the device layout of FIG. 9, the channel forming portion of the gate conductor 110 of the first NMOS transistor TN1 extends from the upper left to the lower right. The channel forming portion of the gate conductor 110 of the second NMOS transistor TN2 extends from the upper right to the lower left. The channel forming portion of the gate conductor 110 of the third NMOS transistor TN3 extends from the upper left to the lower right. The channel forming portion of the gate conductor 110 of the fourth NMOS transistor TN4 extends from the upper right to the lower left. Accordingly, the electron channel of the first NMOS transistor TN1 extends from the upper right to the lower left, the electron channel of the second NMOS transistor TN2 extends from the upper left to the lower right, the electron channel of the third NMOS transistor TN3 extends from the lower left to the upper right, and the electron channel of fourth NMOS transistor TN4 extends from the lower right to the upper left.

Figure 10:
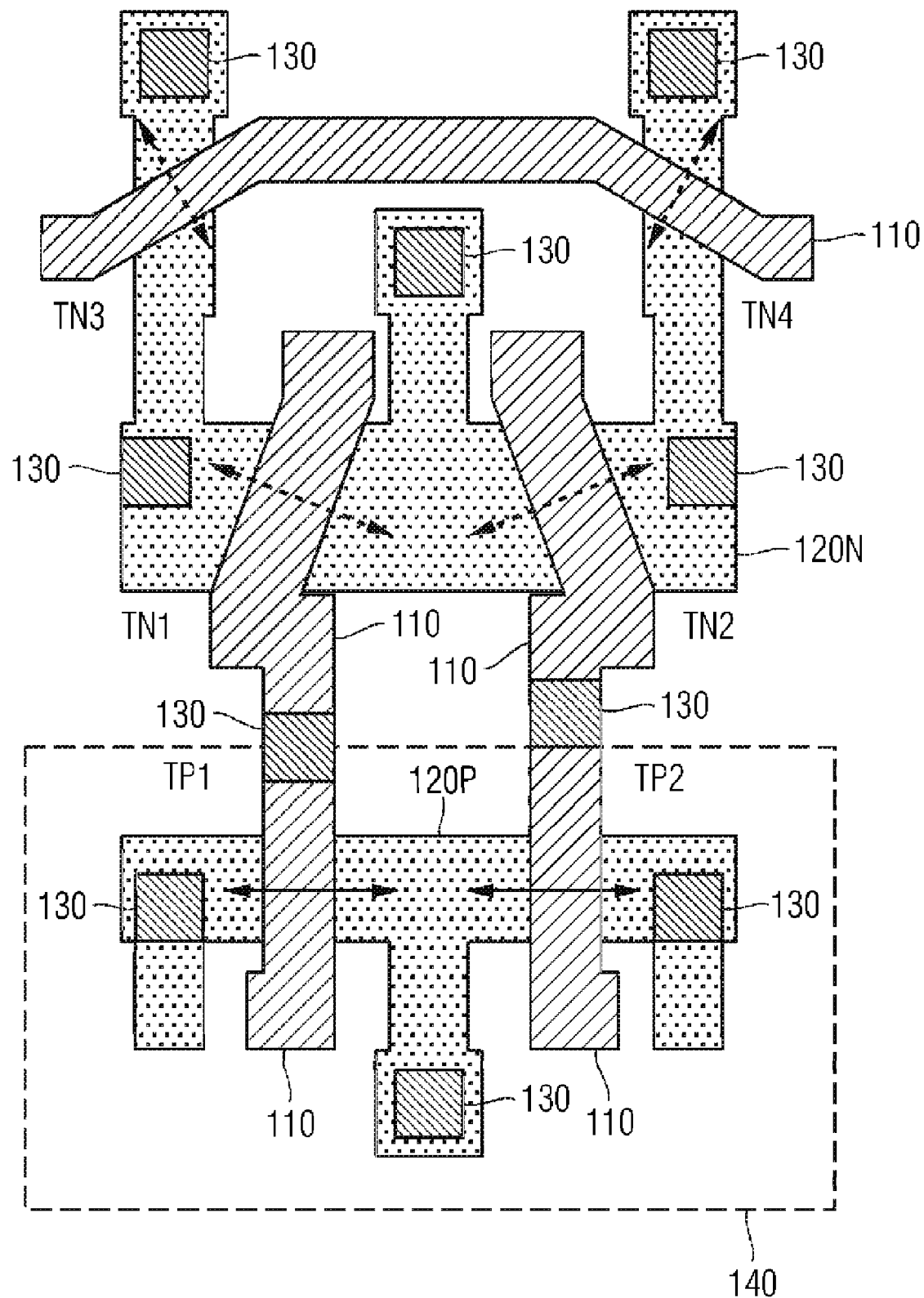

FIG. 10 schematically represents another illustrative device layout of an SRAM cell in a semiconductor device. The device layout according to FIG. 10 generally corresponds to that of FIG. 9, and similar components have been designated with the same reference signs. In the following, only the differences as compared to the device layout of FIG. 9 will be explained.

As compared to the device layout of FIG. 9, the device layout of FIG. 10 has the channel forming portion of the gate conductor 110 of the first NMOS transistor TN1 extending from the lower left to the upper right, the channel forming portion of the gate conductor 110 of the second NMOS transistor TN2 extending from the upper left to the lower right, the channel forming portion of the gate conductor 110 of the third NMOS transistor TN3 extending from the lower left to the upper right, and the channel forming portion of the gate conductor 110 of the fourth NMOS transistor TN4 extending from the upper left to the lower right. Accordingly, the direction of the electron channel of the first NMOS transistor TN1 extends from the lower right to the upper left, the electron channel of the second NMOS transistor TN2 extends from the lower left to the upper right, the electron channel of the third NMOS transistor extends from the lower right to the upper left, and the electron channel of the fourth NMOS transistor TN4 extends from the lower left to the upper right.

Figure 11:
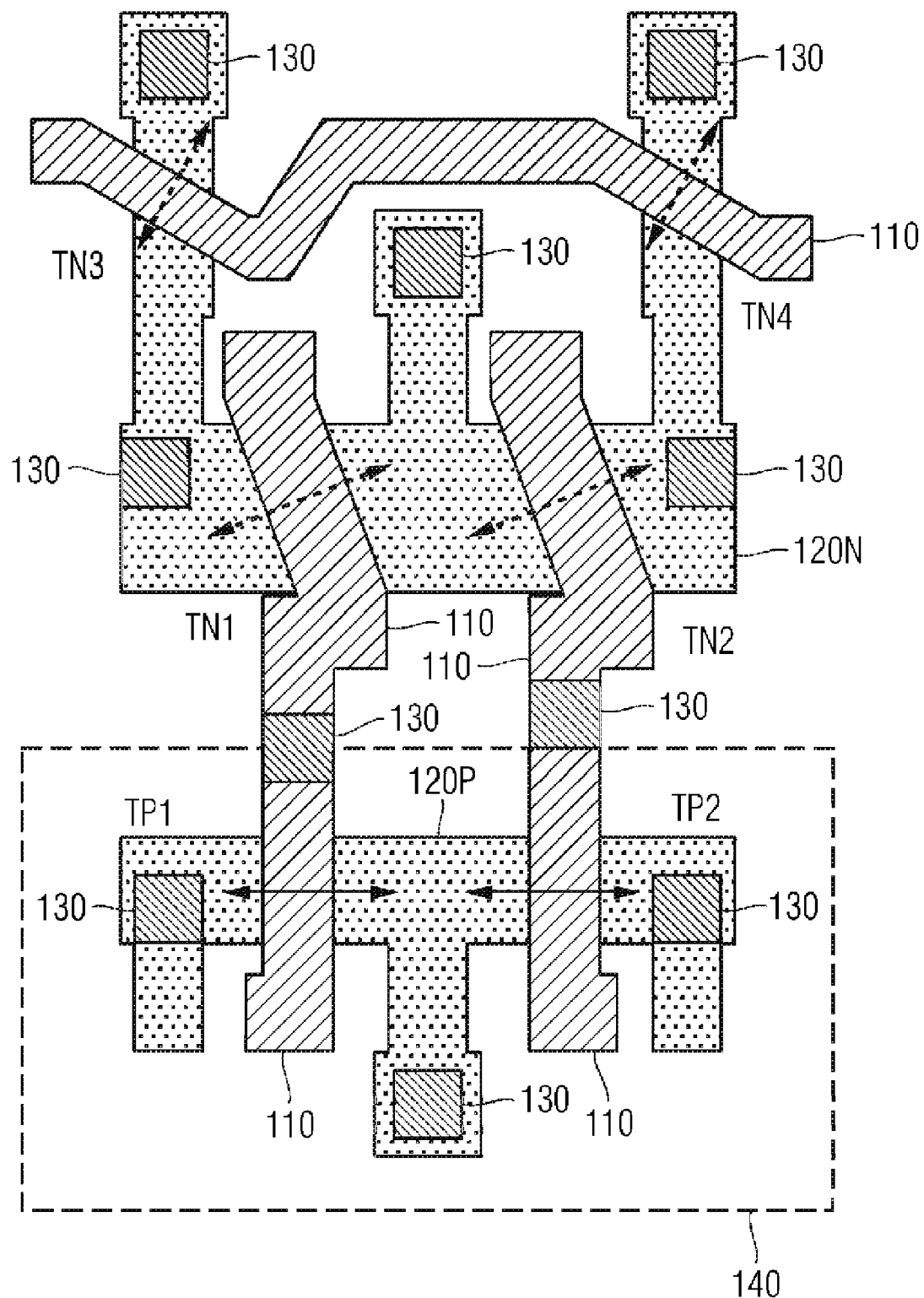

FIG. 11 schematically represents another illustrative device layout of an SRAM cell in a semiconductor device. The device layout of FIG. 11 generally corresponds to that of FIG. 9, and similar components have been designated with the same reference signs. In the following, only the differences as compared to the device layout of FIG. 9 will be explained.

In the device layout of FIG. 11, the channel forming portion of the gate conductor 110 of the second NMOS transistor extends from the upper left to the lower right, and the channel forming portion of the fourth NMOS transistor TN4 extends from the upper left to the lower right. Accordingly, the direction of the electron channel of the second NMOS transistor extends from the lower left to the upper right, and the electron channel of the fourth NMOS transistor extends from the lower left to the upper right.

Figure 12:
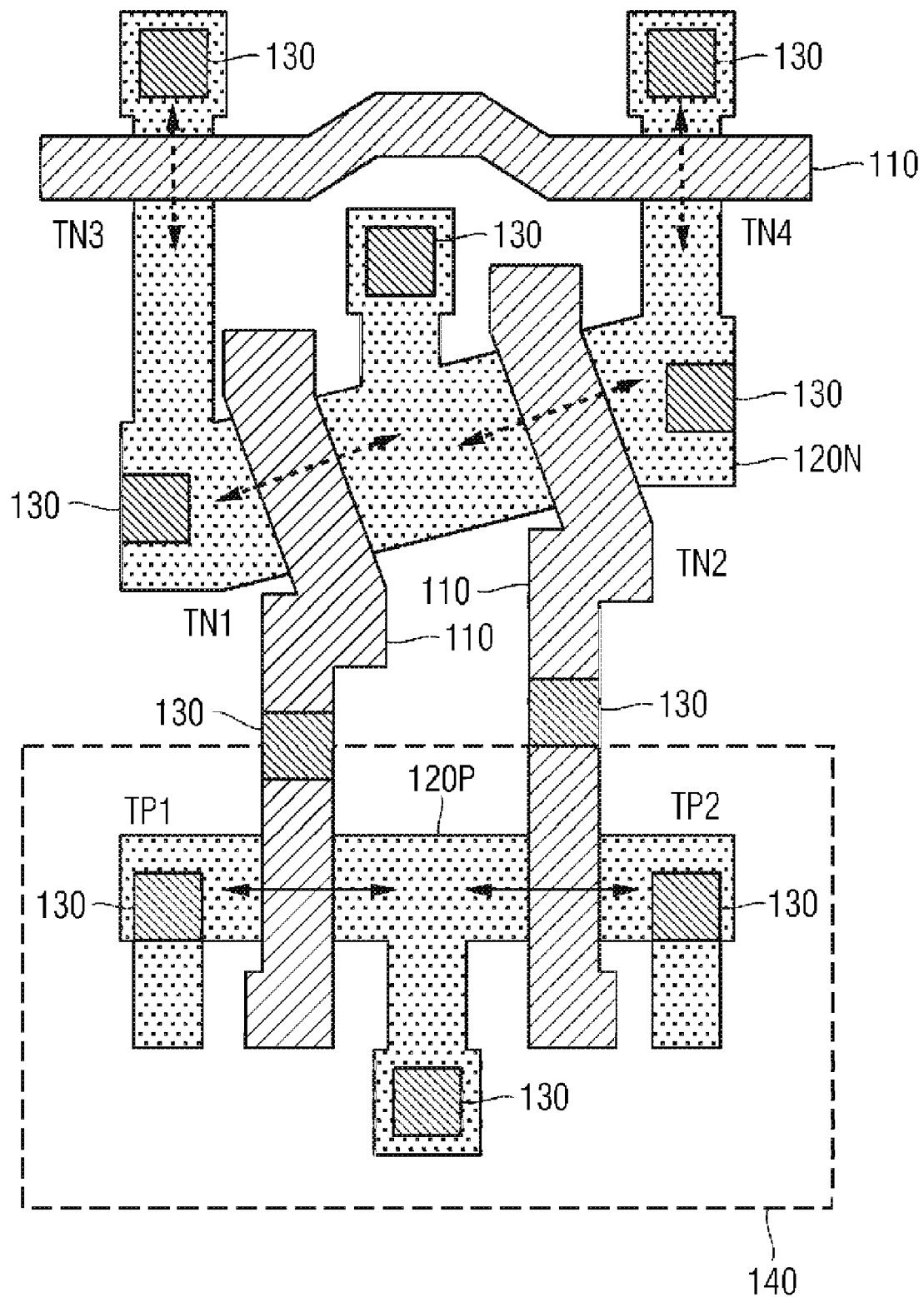

FIG. 12 schematically represents another illustrative device layout of an SRAM cell in a semiconductor device. The device layout according to FIG. 12 generally corresponds to that of FIG. 11, and similar components have been designated with the same reference signs. In the following, only the differences as compared to the device layout of FIG. 11 will be explained.

As compared to the device layout of FIG. 11, which has the channel forming portions of the active area 120N of the first NMOS transistor TN1 and of the second NMOS transistor TN2 arranged so as to extend along the horizontal direction, the device layout of FIG. 12 has the channel forming portions of the active area 120N of the first NMOS transistor TN1 and of the second NMOS transistor TN2 arranged so as to extend at an acute angle with respect to the horizontal and vertical directions, from the lower left to the upper right. Further, channel forming portions of the gate conductor 110 of the third NMOS transistor TN3 and of the fourth NMOS transistor TN4 are arranged along the horizontal direction. Accordingly, the electron channel of the first NMOS transistor TN1 extends from the upper right to the lower left, the electron channel of the second NMOS transistor TN2 extends from the lower left to the upper right, and the electron channels of the third NMOS transistor TN3 and the fourth NMOS transistor TN4 both extend along the vertical direction.

Accordingly, the mobility of the electron channel of the first NMOS transistor TN1, TN2 may be tuned both with respect to the mobility of the hole channel of the PMOS transistors TP1, TP2 and of the NMOS transistors TN3, TN4. As already mentioned above, the function of the third NMOS transistor TN3 and of the fourth NMOS transistor TN4 corresponds to an access transistor. The stability of the information stored in the SRAM cell depends on a leakage current through access transistors. The mobility of the electron channel in the third NMOS transistor TN3 and in the fourth NMOS transistor TN4 may be decreased so as to reduce the leakage current through the NMOS transistors TN3, TN4. This may be achieved by setting the angle of the electron channels in the NMOS transistors TN1, TN2 independently of the angles of the electron channels in the NMOS transistors TN3, TN4.

Figure 13:
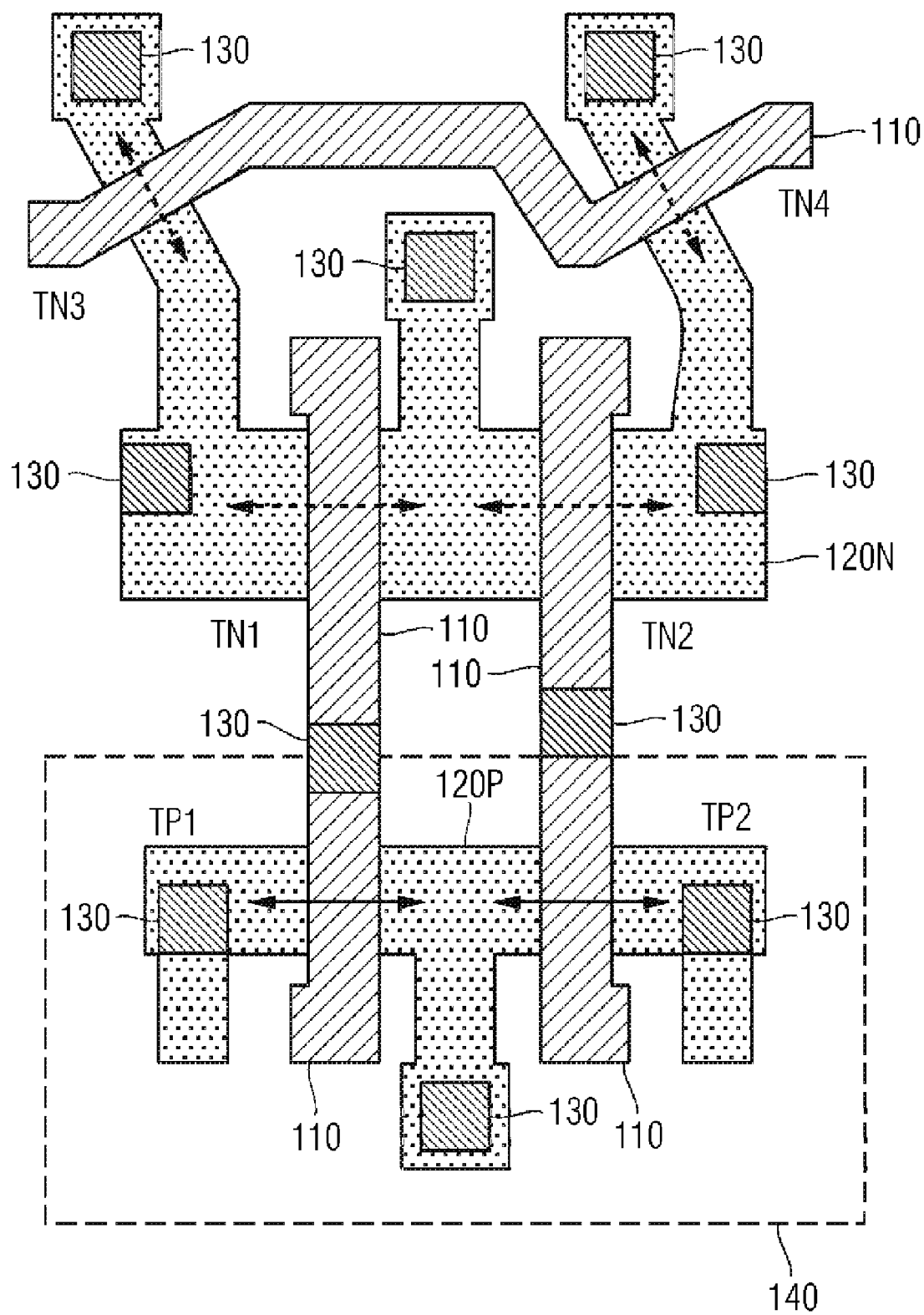

FIG. 13 schematically represents another illustrative device layout of an SRAM cell in a semiconductor device. The device layout generally corresponds to that of FIG. 12, and similar components have been designated with the same reference signs. In the following, only the differences as compared to the device layout of FIG. 12 will be explained.

As compared to the device layout of FIG. 12, which has the channel forming portions of the active area 120N of the first NMOS transistor TN1 and the second NMOS transistor TN2 extending at an acute angle with respect to the vertical and horizontal directions, the device layout of FIG. 13 has the channel forming portions of the active area 120N of the first NMOS transistor TN1 and the second NMOS transistor TN2 extending along the horizontal direction. Further, the channel forming portion of the gate conductor 110 of the first NMOS transistor TN1 and the channel forming portion of the gate conductor 110 of the second NMOS transistor TN2 extend along the vertical direction. Accordingly, the electron channels in the first NMOS transistor TN1 and in the second NMOS transistor TN2 extend along the horizontal direction. The channel forming portion of the active area 120N of the third NMOS transistor TN3 and of the fourth NMOS transistor TN4 extend from the lower right to the upper left. Further, the channel forming portion of the gate conductors 110 of the third NMOS transistor TN3 and of the fourth NMOS transistor TN4 extend from the lower left to the upper right. Accordingly, the electron channels of the third NMOS transistor TN3 and of the fourth NMOS transistor TN4 extend from the lower right to the upper left. Accordingly, in this embodiment, the electron channels of the third NMOS transistor TN3 and of the fourth NMOS transistor TN4 extend at an acute angle with respect to the electron channels of the first NMOS transistor TN1 and of the second NMOS transistor TN2 and with respect to the hole channels of the first PMOS transistor TP1 and of the second PMOS transistor TP2.

Figure 14:
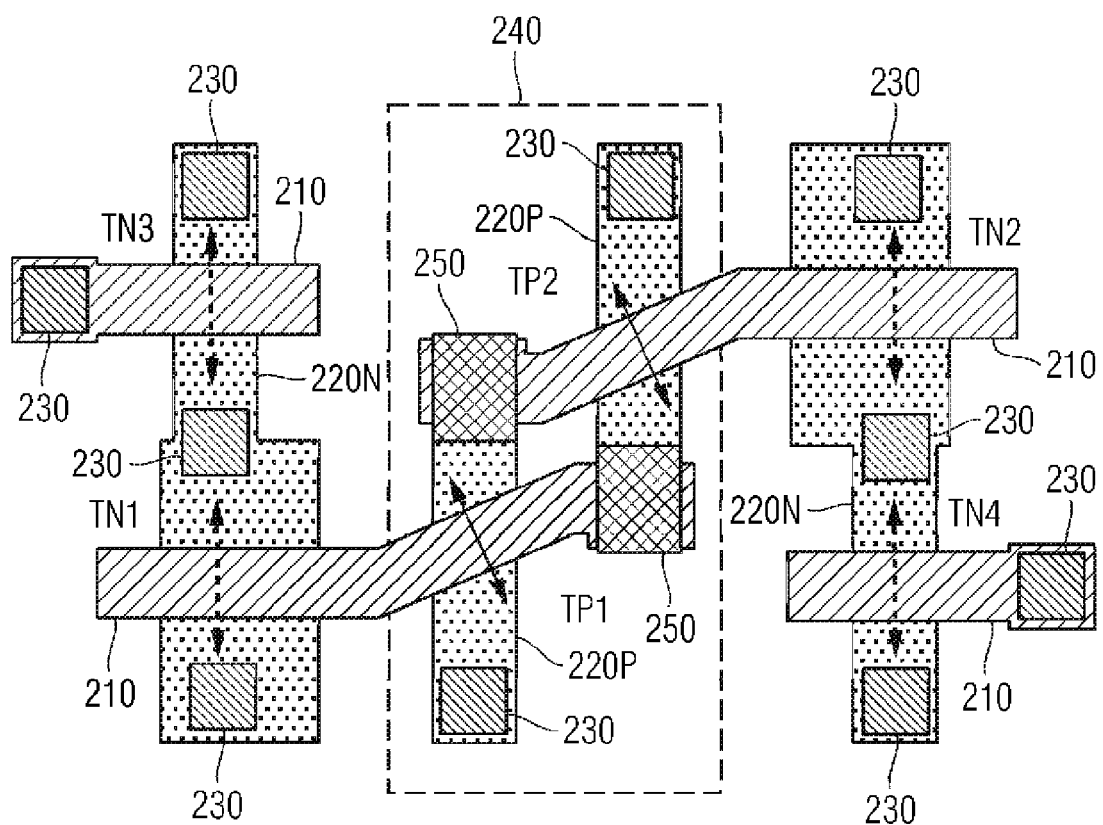

FIG. 14 schematically represents another illustrative device layout of an SRAM cell in a semiconductor device. This circuit layout corresponds to an alternative implementation of the circuit diagram as illustrated in FIG. 3.

According to this device layout, the NMOS transistors TN1, TN2, TN3, TN4 are implemented in active areas 220N. The PMOS transistors TP1, TP2 are implemented in active areas 220P. The active areas 220P are provided in n-well of the P-type semiconductor substrate. In other embodiments, the active areas 220N of the NMOS transistors TN1, TN2, TN3, TN4 may be provided in p-wells of an n-type semiconductor substrate.

Gate conductors 210 are provided and electrically isolated from the respective active areas by means of a gate oxide (not illustrated). Electrical contacts 230 are provided, e.g. by vias with respect to a respective conductive layer.

As illustrated in FIG. 14, the first NMOS transistor TN1 and the first PMOS transistor TP1 have a common gate conductor 210. One end of the common gate conductor is connected to the active area 220P of the second PMOS transistor TP2 at a connection region 250. Similarly, the second NMOS transistor TN2 and the second PMOS transistor TP2 have a common gate conductor 210 which has one of its ends connected to the active area 220P of the first PMOS transistor TP1 at a connection region 250. The connection regions 250 are also connected to a respective conductive layer, e.g. by vias, so as to establish the electrical connections as illustrated in FIG. 3.

A channel forming portion of the active area 220N of the third NMOS transistor TN3 and of the fourth NMOS transistor TN4, which have the function of access transistors, is formed with a smaller width than the channel forming portion of the active area 220N in the first NMOS transistor TN1 and the second NMOS transistor TN2, thereby reducing a leakage current.

In the NMOS transistors TN1, TN2, TN3, TN4, the channel forming portions of the gate conductors 210 extend perpendicular to the respective channel forming portions of the active area 220N, which is the vertical direction of the figure.

In the device layout of FIG. 14, the vertical direction of the figure may correspond to an <110>-type direction on a {100}-type surface of the semiconductor substrate. In other embodiments, other surface orientations and rotations of the semiconductor substrate may be provided.

As further illustrated, the channel forming portions of the active areas 220P of the first PMOS transistor TP1 and of the second PMOS transistor TP2 extend along the vertical direction as well, whereas the channel forming portions of the corresponding gate conductors 210 extend at an acute angle with respect to the vertical and horizontal directions, from the lower left to the upper right. Accordingly, the hole channels of the first PMOS transistor TP1 and of the second PMOS transistor TP2 extend from the lower right to the upper left, at an acute angle with respect to the vertical direction and with respect to the direction of the electron channels of the NMOS transistors TN1, TN2, TN3, TN4.

By means of the device layout according to this embodiment, the direction of the hole channels of the PMOS transistors TP1, TP2 are rotated from the <110>-type direction toward the <100>-type direction thereby improving the mobility of both the electron channels and the hole channels.

In FIG. 14, the directions of the electron channels and of the hole channels are denoted as explained with reference to FIG. 2.

Figure 15:
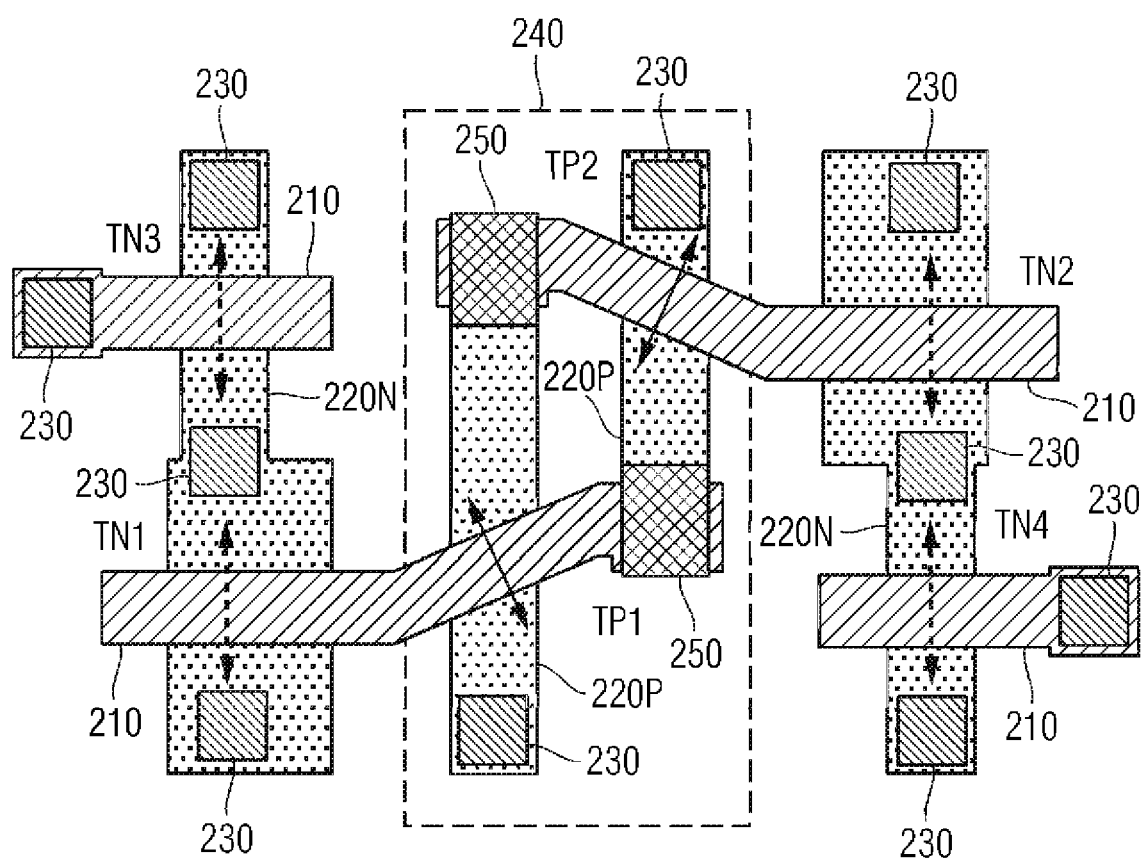

FIG. 15 schematically represents another illustrative device layout of an SRAM cell in a semiconductor device. The device layout of FIG. 15 generally corresponds to that of FIG. 14, and similar components have been designated with the same reference signs. In the following, only the differences as compared to the device layout of FIG. 14 will be explained.

In the device layout of FIG. 15, the gate conductor 210 of the second PMOS transistor TP2 extends from the upper left to the lower right. Accordingly, the direction of the hole channel of the second PMOS transistor TP2 extends at an acute angle with respect to the vertical and horizontal directions from the lower left to the upper right.

Figure 16:
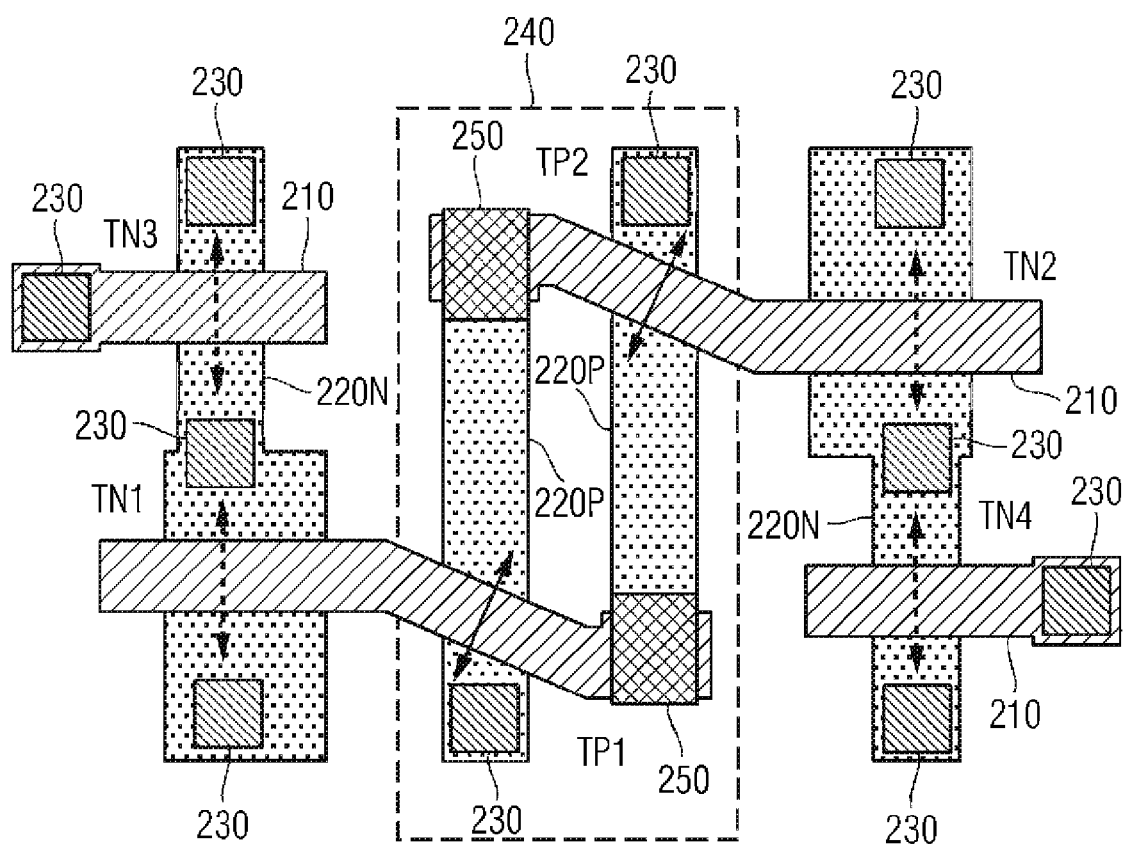

FIG. 16 schematically represents another illustrative device layout of an SRAM cell in a semiconductor device. The device layout according to FIG. 16 generally corresponds to that of FIG. 15, and similar components have been designated with the same reference signs. In the following, only the differences as compared to the device layout of FIG. 15 will be explained.

In the device layout of FIG. 16, the channel forming portion of the gate conductor 210 of the first PMOS transistor TP1 extends from the upper left to the lower right. Accordingly, the hole channel of the first PMOS transistor TP1 extends from the lower left to the upper right, at an acute angle with respect to the direction of the electron channels of the NMOS transistors TN1, TN2, TN3, TN4 and with respect to the vertical and horizontal directions. The direction of the hole channel in the first PMOS transistor TP1 is substantially parallel to the direction of the hole channel in the second PMOS transistor TP2.

Figure 17:
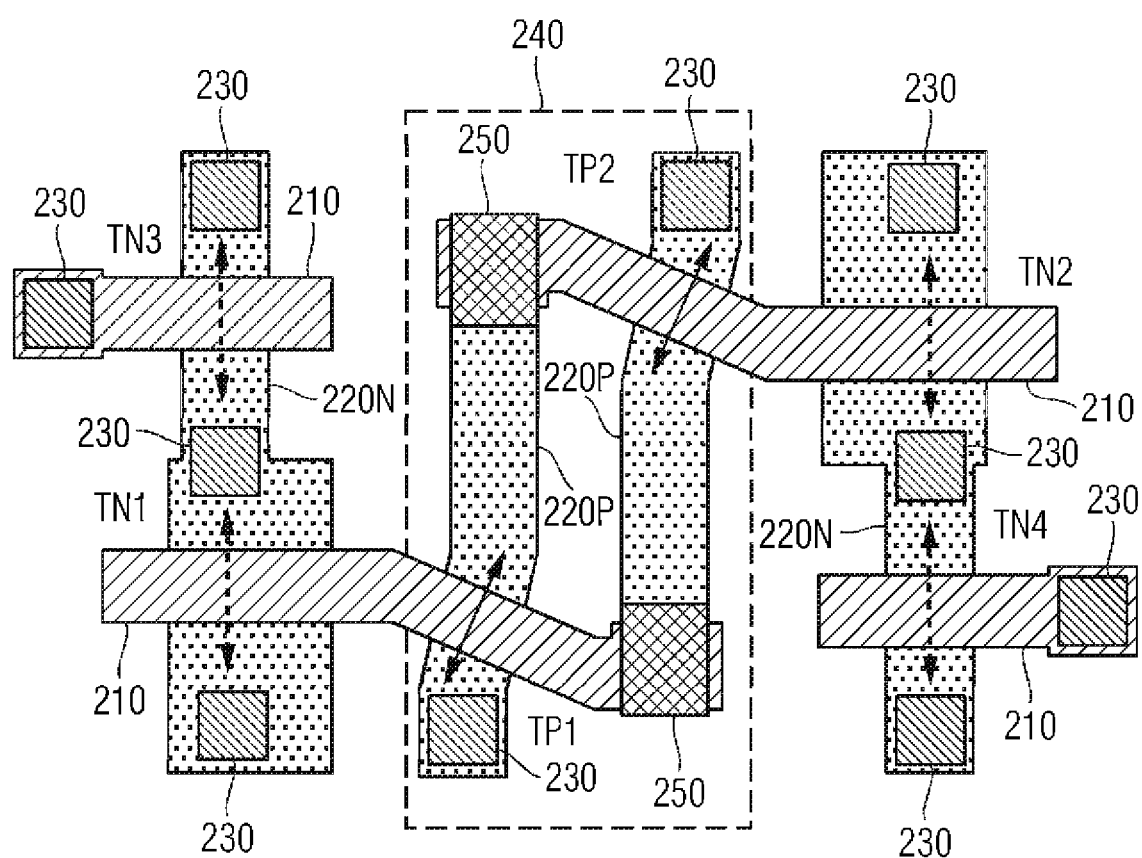

FIG. 17 schematically represents another illustrative device layout of an SRAM cell in a semiconductor device. The device layout of FIG. 17 generally corresponds to that of FIG. 16, and similar components have been designated with the same reference signs. In the following, only the differences as compared to the device layout of FIG. 16 will be described.

As compared to the device layout of FIG. 16, in which the channel forming portions of the active area 220P of the first PMOS transistor TP1 and of the second PMOS transistor TP2 extend along the vertical direction, the circuit layout according to FIG. 17 has the channel forming portions of the active area 220P of the first PMOS transistor TP1 and of the second PMOS transistor TP2 extending at an acute angle with respect to the vertical direction, from the lower left to the upper right. On the one hand, this may further help to align the direction of the hole channel with the desired direction. On the other hand, this may modify the stress conditions of the hole channel, which may provide a further degree of freedom to control the mobility of the hole channel.

Figure 18:
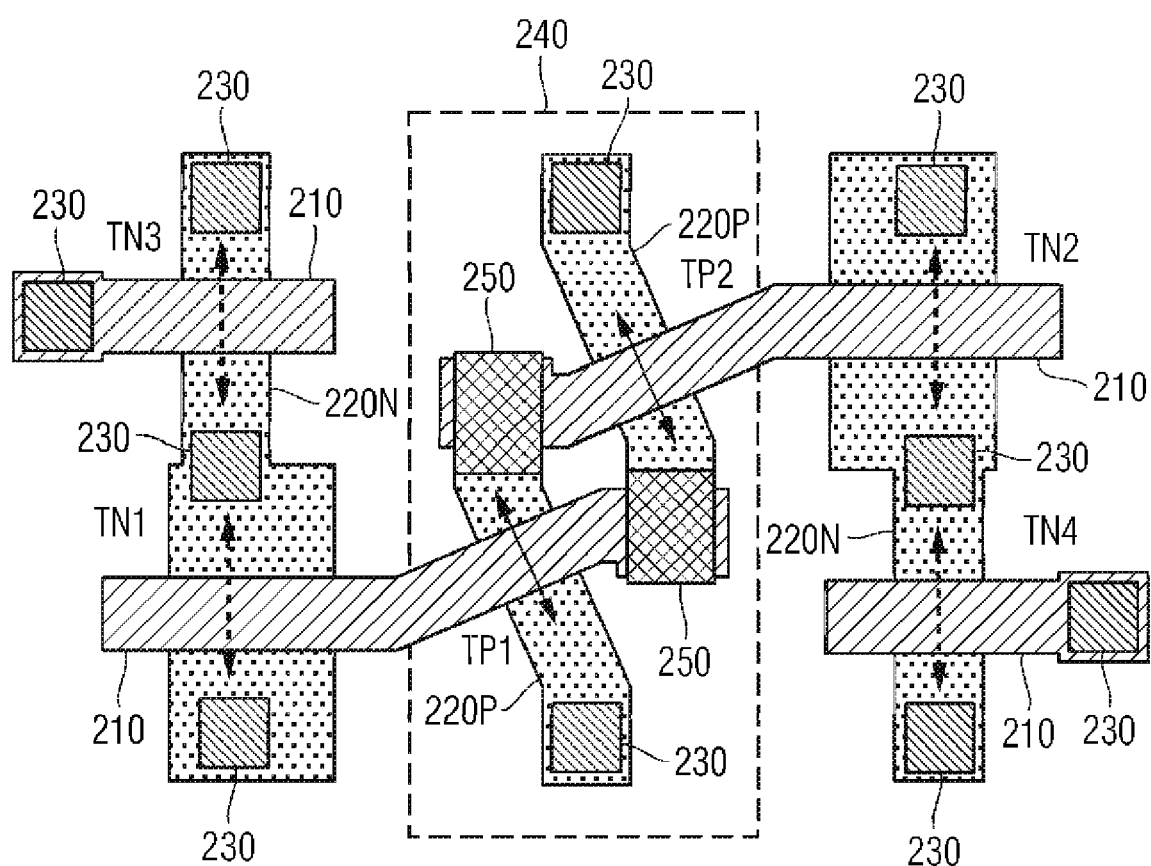

FIG. 18. schematically represents another illustrative device layout of an SRAM cell in a semiconductor device. The device layout of FIG. 18 generally corresponds to that of FIG. 14, and similar components have been designated with the same reference signs. In the following, only the differences as compared to the device layout of FIG. 14 will be described.

As compared to the device layout of FIG. 14, which has the channel forming portions of the active areas 220P of the first PMOS transistor TP1 and of the second PMOS transistor TP2 extending along the vertical direction, the circuit layout of FIG. 18 has the channel forming portions of the active areas 220P of the first PMOS transistor TP1 and of the second PMOS transistor TP2 extending at an acute angle with respect to the vertical and horizontal directions, from the lower right to the upper left.

Figure 19:
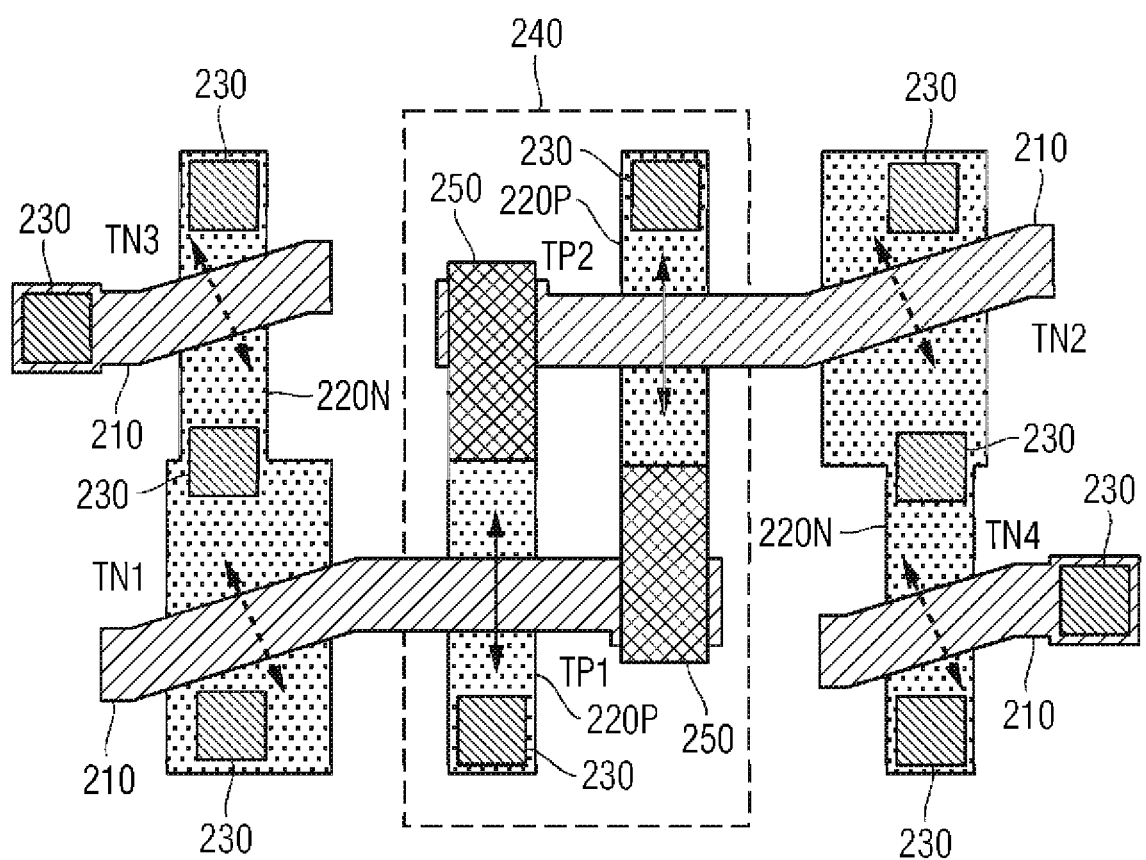

FIG. 19 schematically represents another illustrative device layout of an SRAM cell in a semiconductor device. The device layout of FIG. 19 generally corresponds to that of FIG. 14, and similar components have been designated with the same reference signs. In the following, only the differences as compared to the device layout of FIG. 14 will be explained.

Whereas the device layout of FIG. 14 has the channel forming portions of the gate conductors 210 of the first PMOS transistor TP1 and of the second PMOS transistor TP2 extending at an acute angle with respect to the vertical and horizontal directions, and the channel forming portions of the gate conductors 210 of the NMOS transistors TN1, TN2, TN3, TN4 are arranged along the vertical direction, the device layout of FIG. 19 has the channel forming portions of the gate conductors 210 of the NMOS transistors TN1, TN2, TN3, TN4 arranged at an acute angle with respect to the vertical and horizontal directions, and the channel forming portions of the gate conductors 210 in the PMOS transistors TP1, TP2 extending along the vertical direction. Accordingly, the direction of the electron channels in the NMOS transistors TN1, TN2, TN3, TN4 forms an acute angle with respect to the direction of the hole channels in the PMOS transistors TP1, TP2 and with respect to vertical and horizontal directions. The directions of the electron channels are the same, i.e. parallel to each other.

The device layout of FIG. 19 may be used with the same substrate rotation as the circuit layout of FIG. 14, i.e. the vertical direction in the Figure may extend along the <110>-type direction of a {100}-type surface. According to other embodiments, the semiconductor substrate may be rotated by 45 degrees, thereby aligning the vertical direction of the figure with the <100>-type direction of the {100}-type surface. In this way, a high mobility may be obtained for both the hole channels of the PMOS transistors TP1, TP2 and for the electron channels of the NMOS transistors TN1, TN2, TN3, TN4. In further embodiments, different surface orientations and substrate rotations may be used.

Figure 20:
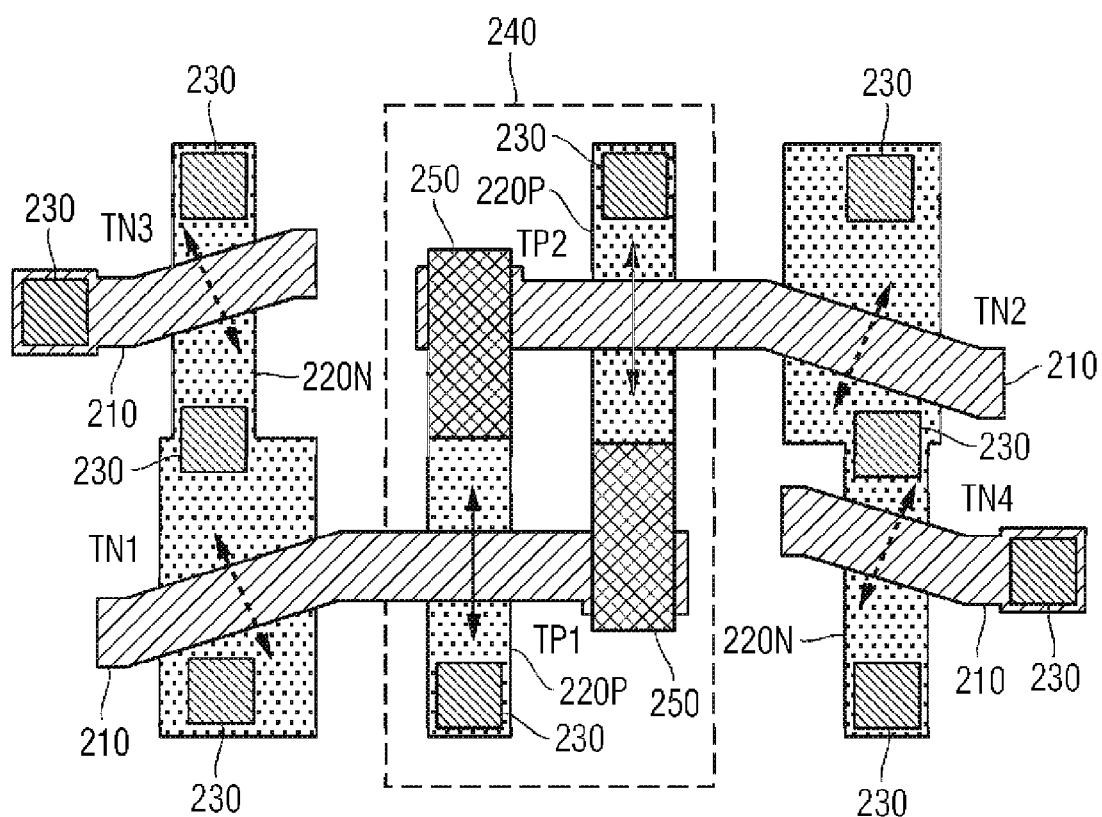

FIG. 20 schematically represents another illustrative device layout of an SRAM cell in a semiconductor device. The device layout of FIG. 20 generally corresponds to that of FIG. 19, and similar components have been designated with the same reference signs. In the following, only the differences as compared to the device layout of FIG. 19 will be explained.

As compared to the device layout of FIG. 19, the device layout of FIG. 20 has the channel forming portion of the gate conductor 210 in the second and fourth NMOS transistor TN2, TN4 extending from the upper left to the lower right. Accordingly, the electron channels of the second NMOS transistor TN2 and of the fourth NMOS transistor TN4 extend from the lower left to the upper right, at an acute angle with respect to the direction of the hole channels of the PMOS transistors TP1, TP2 and with respect to the vertical and horizontal directions.

Figure 21:
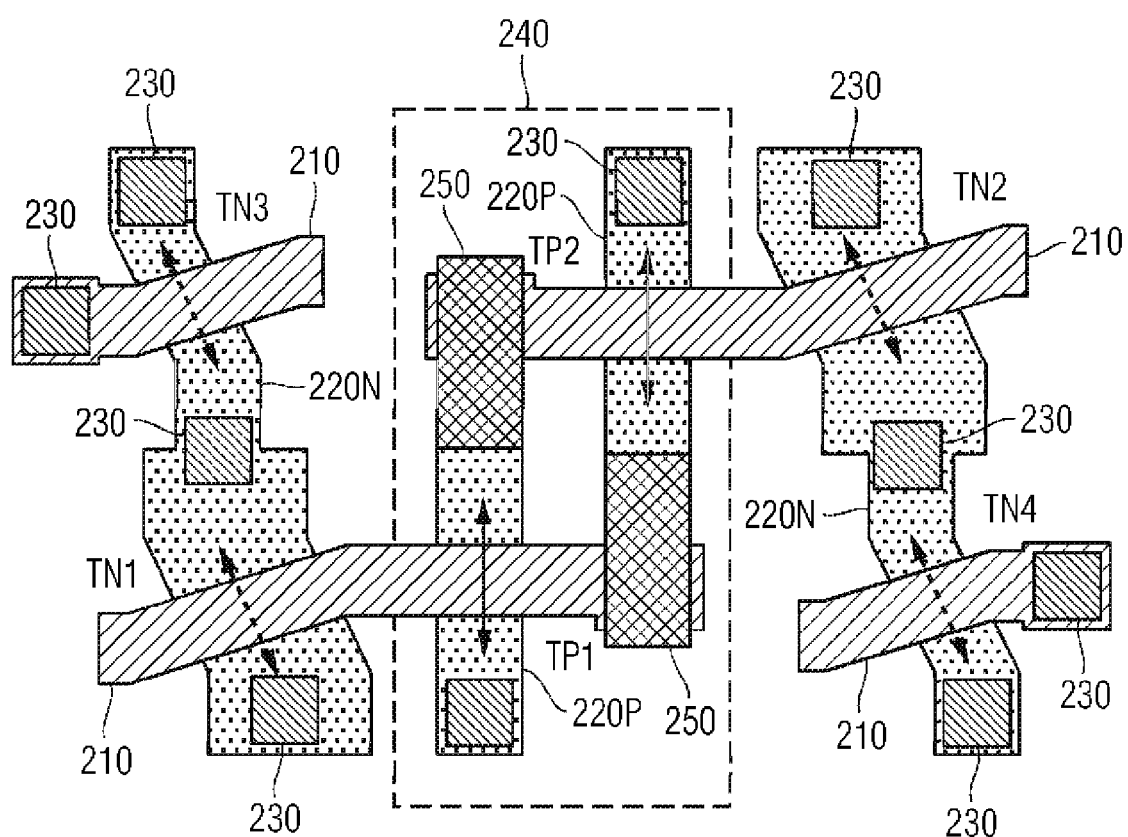

FIG. 21 schematically represents another illustrative device layout of an SRAM cell in a semiconductor device. The device layout generally corresponds to that of FIG. 19, and similar components have been designated with the same reference signs. In the following, only the differences as compared to the device layout of FIG. 19 will be explained.

As compared to the device layout of FIG. 19, which has the channel forming portions of the active areas 220N of the NMOS transistors TN1, TN2, TN3, TN4 extending along the vertical direction, the circuit layout of FIG. 21 has the channel forming portions of the active areas 220N of the NMOS transistors TN1, TN2, TN3, TN4 extending at an acute angle with respect to the vertical and horizontal directions, from the lower right to the upper left. On the one hand, this may help to align the direction of the electron channels with the desired direction. On the other hand, this may modify the stress conditions in the electron channels, thereby potentially providing a further degree of freedom to control the mobility of the electron channels.

Figure 22:
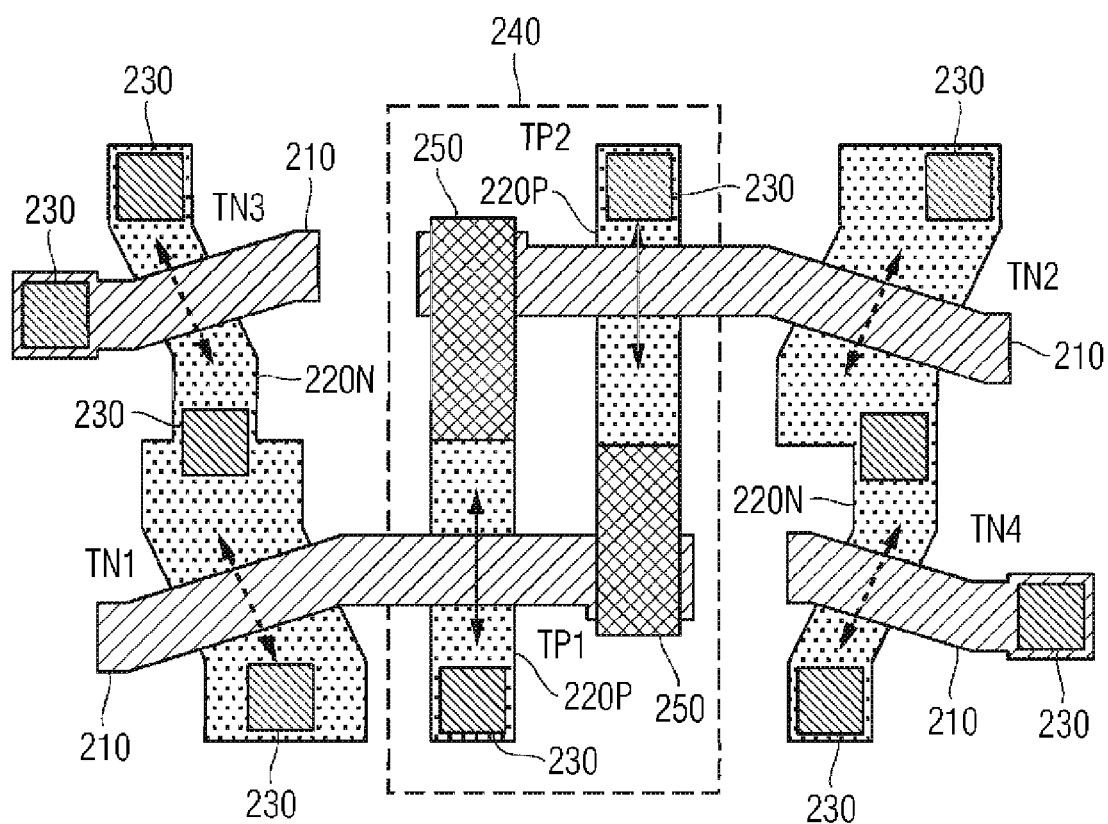

FIG. 22 schematically represents another illustrative device layout of an SRAM cell in a semiconductor device. The device layout of FIG. 22 generally corresponds to that of FIG. 21, and similar components have been designated with the same reference signs. In the following, only the differences as compared to the device layout of FIG. 21 will be explained.

As compared to the device layout of FIG. 21, the circuit layout of FIG. 22 has the channel forming portions of the active area 220N of the second NMOS transistor TN2 and of the fourth NMOS transistor TN4 extending from the lower left to the upper right. Further, in the second NMOS transistor TN2 and in the fourth NMOS transistor TN4, the channel forming portion of the gate conductor 210 extends from the upper right to the lower left. Accordingly, the direction of the electron channels in the second NMOS transistor TN2 and in the fourth NMOS transistor TN4 extends from the lower left to the upper right, at an acute angle with respect to the direction of the hole channels in the PMOS transistors TP1, TP2 and with respect to the vertical and horizontal direction.

Figure 23:
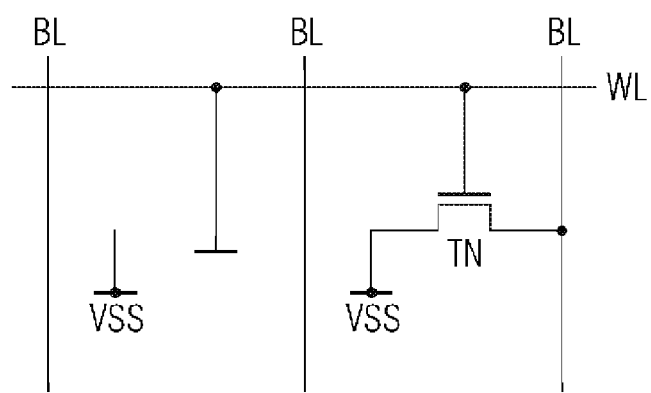
FIGS. 23-26 schematically represent various partial circuit diagrams of a ROM array in a semiconductor device according to various illustrative embodiments.

FIG. 23 schematically represents a partial circuit diagram of an illustrative embodiment of a read only memory (ROM) array. As illustrated in the present embodiment, the ROM array includes bit lines BL and word lines WL for addressing memory cells of the ROM array. The entire circuit may also include other components such as sensing amplifiers, control logic etc. In the ROM array, information may be stored by selectively defining portions of a transistor or connections of the transistor with respect to a predetermined voltage, in the illustrated example, a low supply voltage VSS. On the left hand side of FIG. 23, a memory cell is illustrated, which has been assigned a value "1". For reading the memory cell, the corresponding bit line BL is charged to a high value, and the memory cell is accessed using the word line WL to control a gate contact. However, on the left hand side, a source-drain-channel of a memory cell transistor is not provided in this example, which may result in a read operation not changing the precharged state of the bit line BL.

On the right hand side of FIG. 23, a memory cell is illustrated, which has been assigned a value "0" by defining a transistor TN. If the corresponding bit line BL is precharged to a high value and the memory cell is addressed using the word line WL, the bit line BL is pulled to the low supply voltage VSS, thereby giving a low value as the result of the read operation.

A ROM memory cell may be implemented using one or more NMOS transistors and/or PMOS transistors. However, even in the event that the memory cell is implemented with a single transistor type only, other transistor types may be present in other portions of the circuit that may exist, such as in the control logic or the sensing amplifiers.

Figure 24:
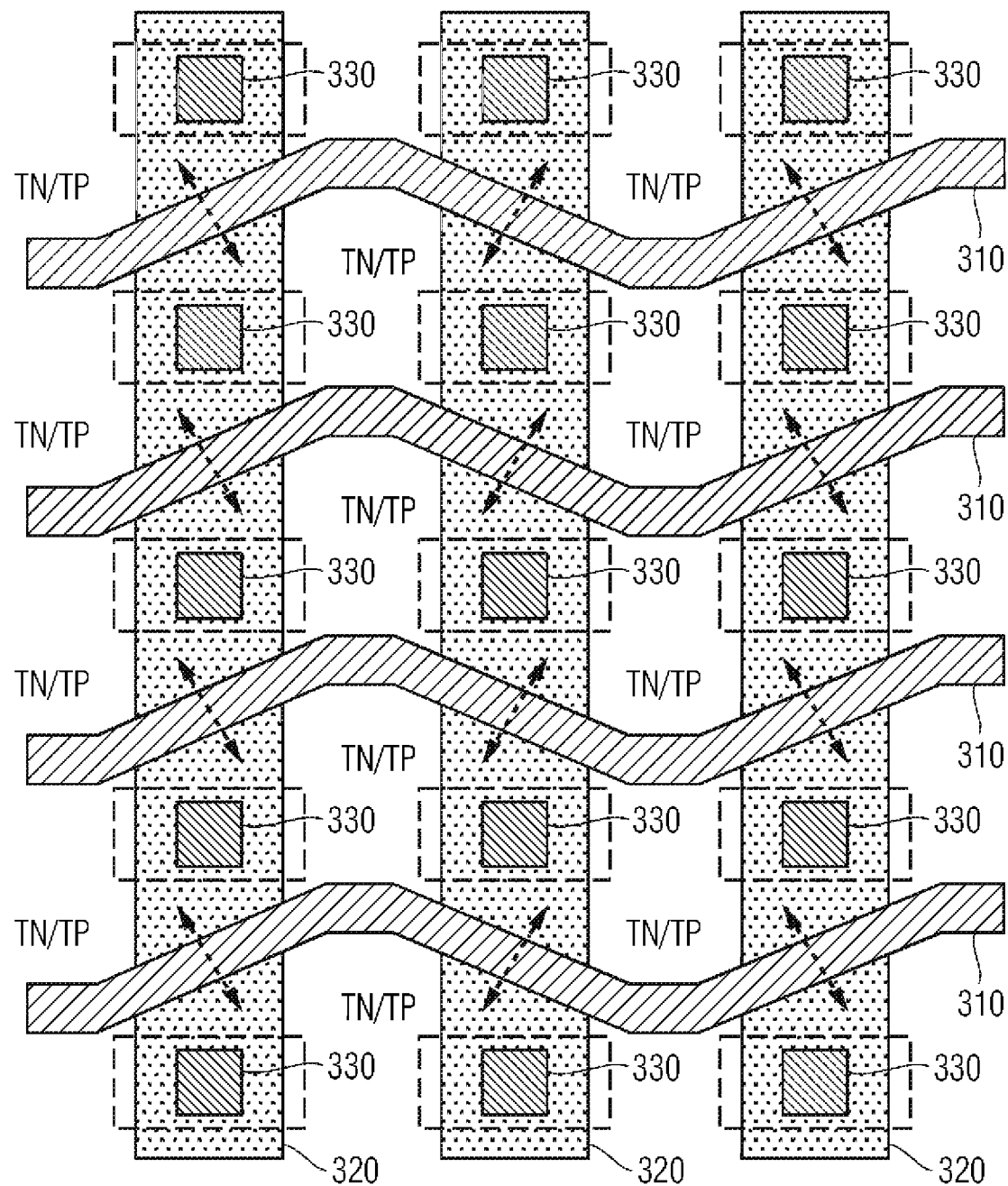

FIG. 24 schematically represents an illustrative partial device layout of a ROM array in a semiconductor device. The device layout comprises active areas 320 for defining NMOS transistors or PMOS transistors TN/TP between contact areas 330. In the contact areas 330, a connection may be established with respect a predefined potential, such as the low supply voltage VSS of FIG. 23. This may be accomplished in selective manner so as to store information in the ROM array at manufacture of the semiconductor device.

As illustrated, channel forming portions of the active areas 320 extend along the vertical direction of FIG. 24. In embodiments using NMOS transistors, the vertical direction of FIG. 24 may correspond to an <100>-type direction on a {100}-type surface of the semiconductor substrate. In embodiments using PMOS transistors, the vertical direction of FIG. 24 may correspond to an <110>-type direction on a {100}-type surface of the semiconductor substrate. In other embodiments, other surface orientation and substrate rotations may be used.

As further illustrated, the device layout has gate conductors 310 extending in a repeating oscillating shape along the horizontal direction of FIG. 24. Channel forming portions of the gate conductors 310 are formed to extend at an angle with respect to the horizontal and vertical directions, thereby potentially resulting in the electron channel or hole channel of the transistors TN/TP being oriented along a direction which forms an acute angle with respect to the vertical and horizontal directions. If the transistors of the ROM array are NMOS transistors, the direction of the electron channels in the ROM array will form an acute angle with respect to the direction of hole channels in PMOS transistors formed in other portions of the semiconductor device (not illustrated). If the transistors of the ROM array are PMOS transistors, the hole channel will form an acute angle with respect to NMOS transistors formed in other portions of the semiconductor device (not illustrated).

In the embodiment of FIG. 24, the repeated oscillating shape of the gate conductors 310 is aligned with respect to the oscillating shape of the other gate conductors 310 in such a way that the electron channels or hole channels of one active area 320 are all parallel to each other. This may be achieved by having the repeated oscillating shape of adjacent gate conductors 310 "in phase".

Figure 25:
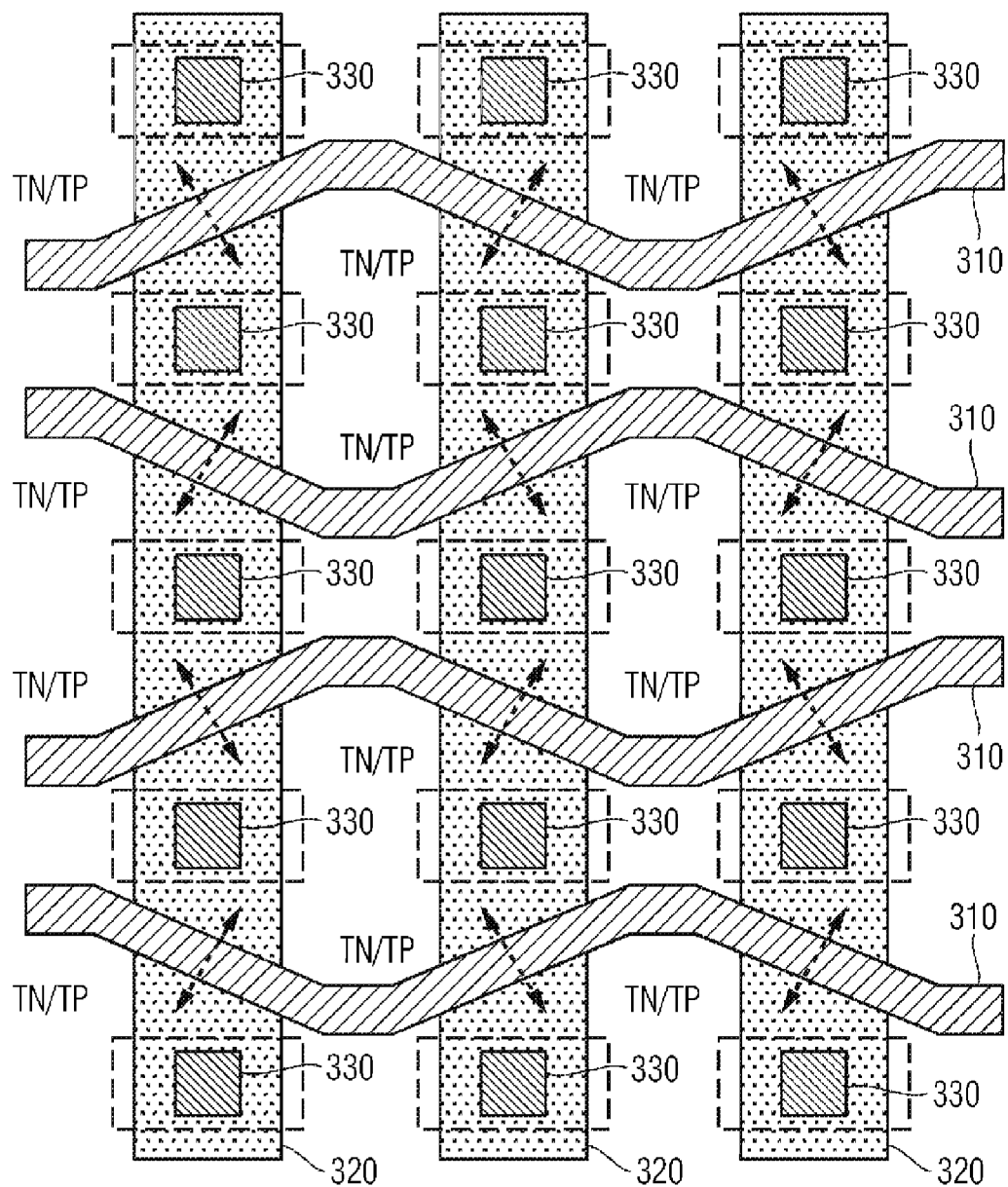

FIG. 25 schematically represents another illustrative partial device layout of a ROM array in a semiconductor device. The device layout generally corresponds to that of FIG. 24, and similar components have been designated with the same reference signs. In the following, only the differences as compared to the device layout of FIG. 24 will be explained.

As compared to the device layout of FIG. 24, the device of FIG. 25 has the repeated oscillating shape of the gate conductors 310 arranged in such a way that adjacent gate conductors 310 are shifted with respect to each other to obtain a phase shift of 180 degrees. That is to say, if a channel forming portion of one gate conductor 310 extends from the lower left to the upper right, the channel forming portion of the adjacent gate conductor 310 on the same active area 320 extends from the upper left to the lower right. Conversely, if a channel forming portion of a gate conductor 310 extends from the upper left to the lower right, the channel forming portion of the adjacent gate conductor 310 on the same active area 320 extends from the lower left to the upper right. In this structure, the transistors TN/TP formed on the same active area 320 will have alternating directions of the electron channel/hole channel.

Figure 26:
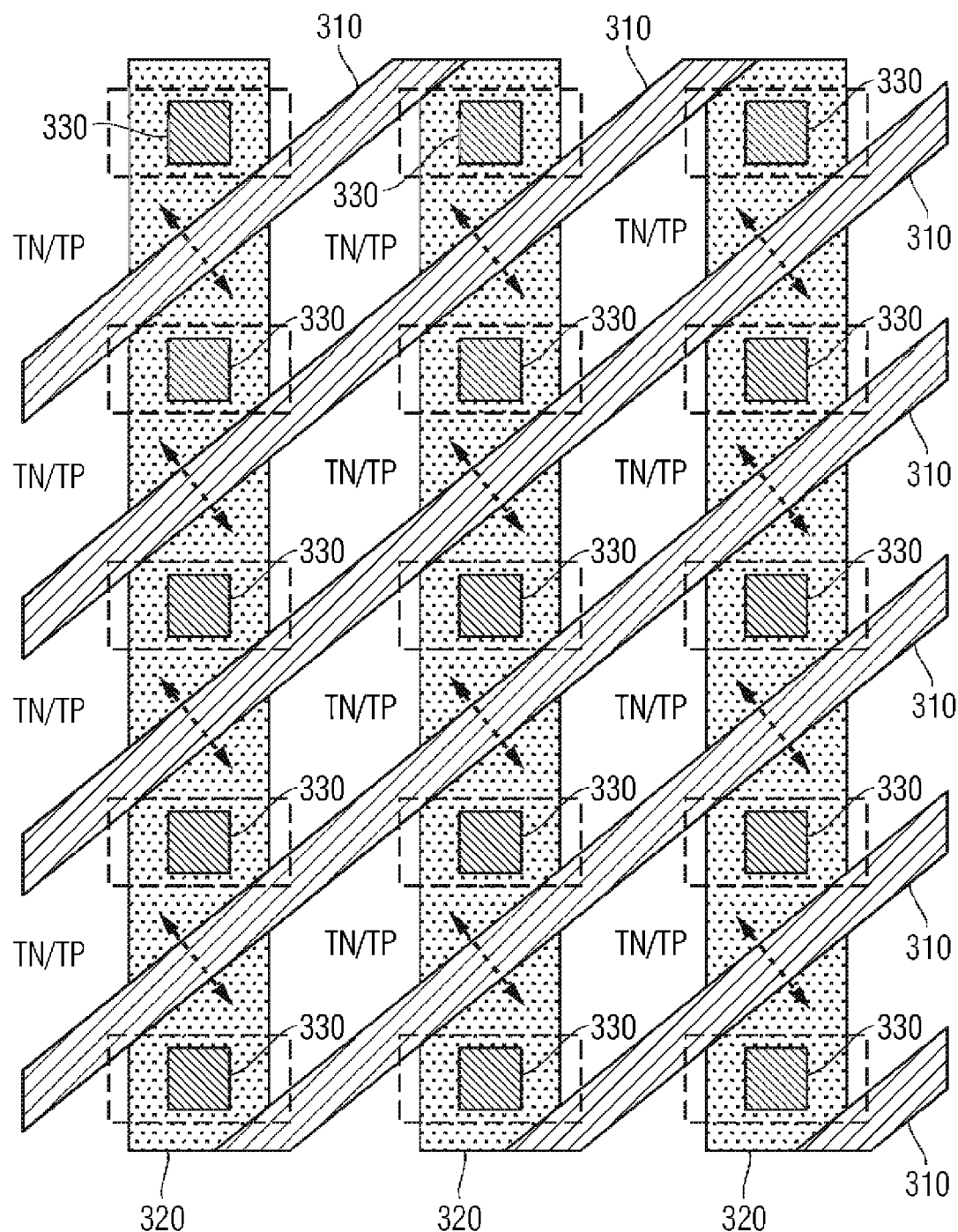

FIG. 26 schematically represents another illustrative partial device layout of a ROM array in a semiconductor device. The device layout generally corresponds to that of FIG. 24, and similar components have been designated with the same reference signs. In the following, only the differences as compared to the device layout of FIG. 24 will be explained.

As illustrated, the device layout of FIG. 26 has gate conductors 310 which linearly extend along a diagonal direction from the lower left to the upper right. Accordingly, electron channels or hole channels are formed in the transistors TN/TP, which extend from the lower right to the upper left. The direction of the electron channels or hole channels is the same for all transistors TN/TP on the same active area 320 and is also the same for transistors TN/TP formed on different active areas 320.

Figure 27:
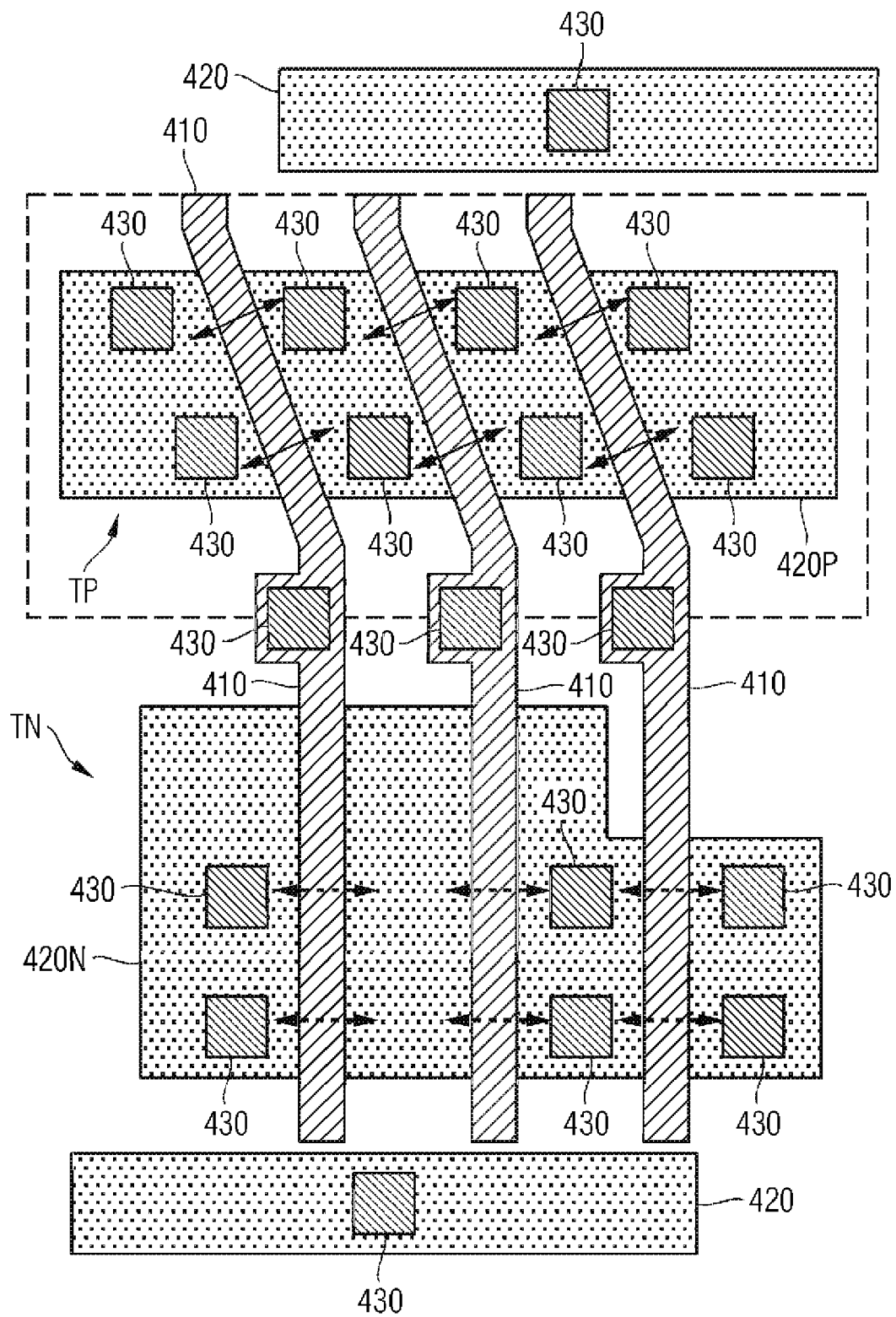
FIG. 27-31 schematically represent various device layouts of a logic cell a semiconductor device according to various illustrative embodiments.

FIG. 27 schematically illustrates an illustrative embodiment of a device layout of a logic cell in a semiconductor device. The logic cell may be used as the basis for implementing logic functions of the semiconductor device, for example in custom-designed integrated circuits, such as application-specific integrated circuits (ASICs). By means of the standard logic cell, a variety of logic functions may be implemented at manufacture of the semiconductor device. In FIG. 27, the modifications of the standard cell for implementing specific logic functions are not illustrated. Rather, only the major components of the standard logic cell have been illustrated.

As illustrated in FIG. 27, the illustrative logic cell includes separated active areas 420, 420P, 420N. In the active area 420P, a plurality of PMOS transistors TP is provided. In the active area 420N, a plurality of NMOS transistors is provided. Common gate conductors 410 extend both over the active area 420P of the PMOS transistors TP and over the active area 420N of the NMOS transistors TN. Similar to FIG. 2, the direction of electron channels of the NMOS transistors TN is illustrated by dotted arrows, and the direction of hole channels of the PMOS transistors TP is illustrated by solid arrows. The gate conductors 410 are electrically isolated from the active areas 420P, 420N by means of a gate oxide (not illustrated). A plurality of contacts 430 is provided so as to realize electrical connections, e.g. by vias provided with respect to a conductive layer.

The active area 420P of the PMOS transistors TP is provided in an n-type well of the p-type semiconductor substrate. In other embodiments, the active area 420N of the NMOS transistors TN may be provided in a p-type well of an n-type substrate.

As further illustrated in FIG. 27, the active areas 420, 420P, 420N are generally aligned with the vertical and horizontal directions of the figure. According to some embodiments, the semiconductor device may be provided on a {100}-type surface of the semiconductor substrate, and the vertical direction of the figure may correspond to a <110>-type direction on the {100}-type surface. According to other embodiments, other surface orientations and substrate rotations may be provided.

As further illustrated in FIG. 27, channel forming portions of the gate conductors 410 of the NMOS transistors TN extend along the vertical direction. Accordingly, the direction of the electron channels in the NMOS transistors TN extends along the horizontal direction, which according to the above-mentioned surface orientation and substrate rotation corresponds to a <110>-type direction. Channel forming portions of the gate conductors 410 of the PMOS transistors TP extend at an acute angle with respect to the vertical and horizontal directions, from the lower right to the upper left. Accordingly, the direction of the hole channels of the PMOS transistors TP extends at an acute angle with respect to the vertical and horizontal directions and with respect to the direction of the electron channels of the NMOS transistors TN, from the lower left to the upper right. According to the above-mentioned surface orientation and substrate rotation, the direction of the hole channels is rotated from the <110>-type direction toward the <100>-type direction, thereby potentially providing a high mobility of both the electron channels and the hole channels.

Figure 28:
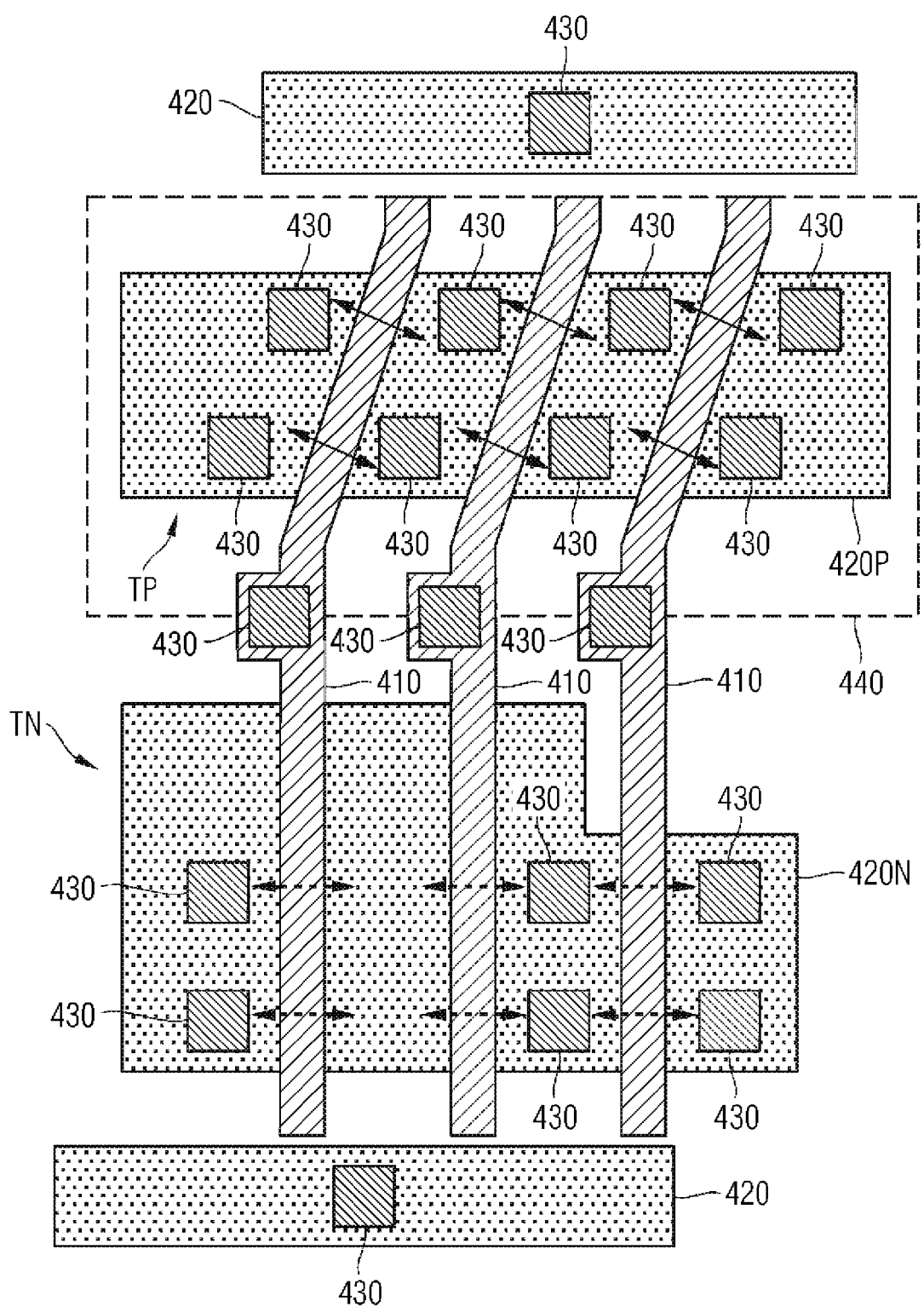

FIG. 28 schematically represents another illustrative device layout of a logic cell in a semiconductor device. The device layout of FIG. 28 generally corresponds to that of FIG. 27, and similar components have been designated with the same reference signs. In the following, only the differences as compared to the device layout of FIG. 27 will be explained.

As compared to the device layout of FIG. 27, the device layout of FIG. 28 has the channel forming portions of the gate conductors 410 in the PMOS transistors TP extending at an acute angle with respect to the vertical and horizontal directions, from the lower left to the upper right. Accordingly, the direction of the hole channels of the PMOS transistors TP extends at an acute angle with respect to the vertical and horizontal directions, from the upper left to the lower right.

Figure 29:
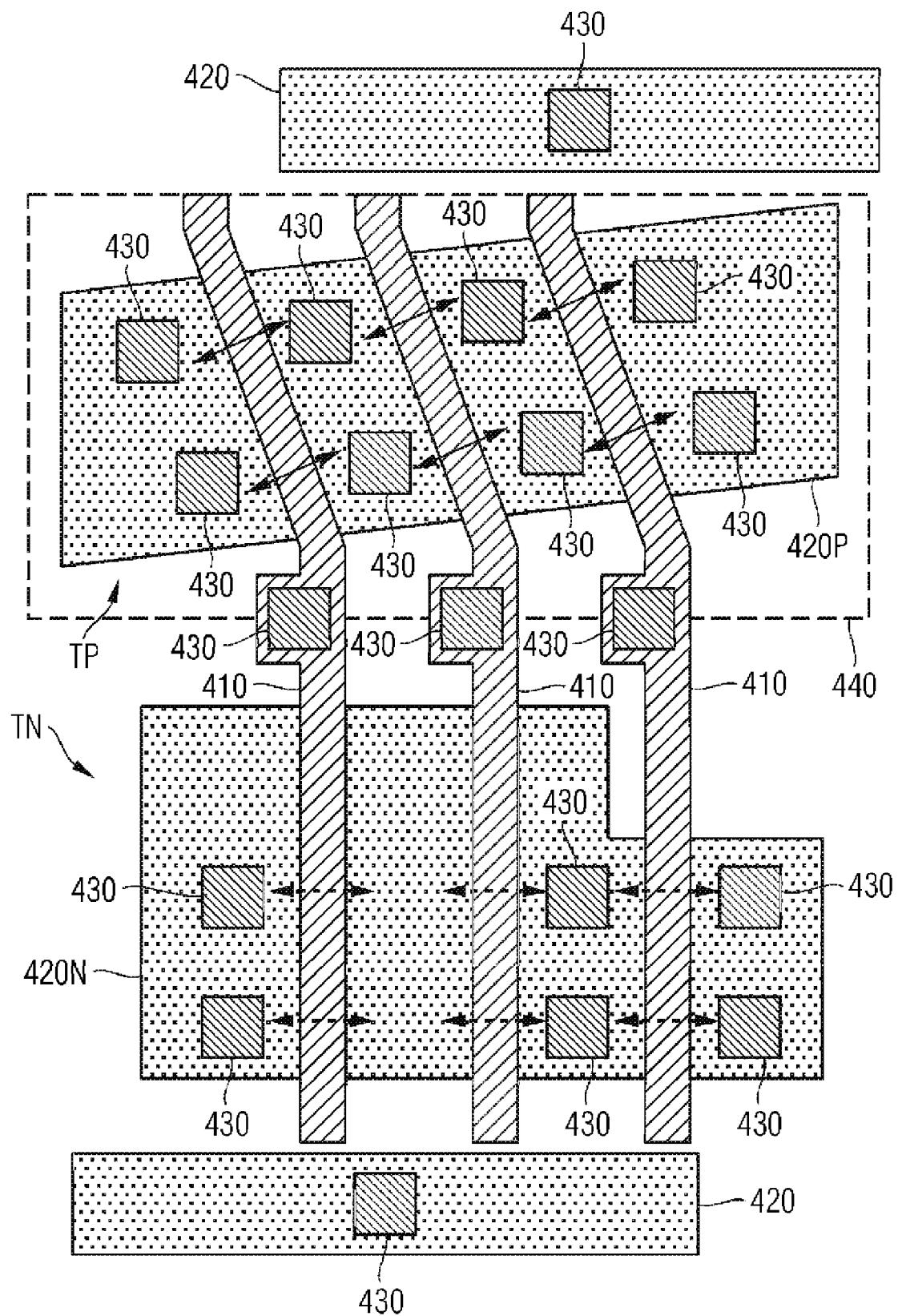

FIG. 29 schematically represents another illustrative device layout of a logic cell in a semiconductor device. The device layout of FIG. 29 generally corresponds to that of FIG. 27, and similar components have been designated with the same reference signs. In the following, only the differences as compared to the device layout of FIG. 27 will be explained.

As compared to the device layout of FIG. 27, which has the channel forming portions of the active area 420P extending along the horizontal direction, the device layout of FIG. 29 has the channel forming portions of the active area 420P of the PMOS transistors TP extending at an acute angle with respect to the vertical and horizontal directions, from the lower left to the upper right. On the one hand, this may help to align the hole channels of the PMOS transistors TP with the desired direction. On the other hand, this may modify the stress conditions of the hole channels of the PMOS transistors TP, thereby potentially providing a further degree of freedom for controlling the mobility of the hole channels.

Figure 30:
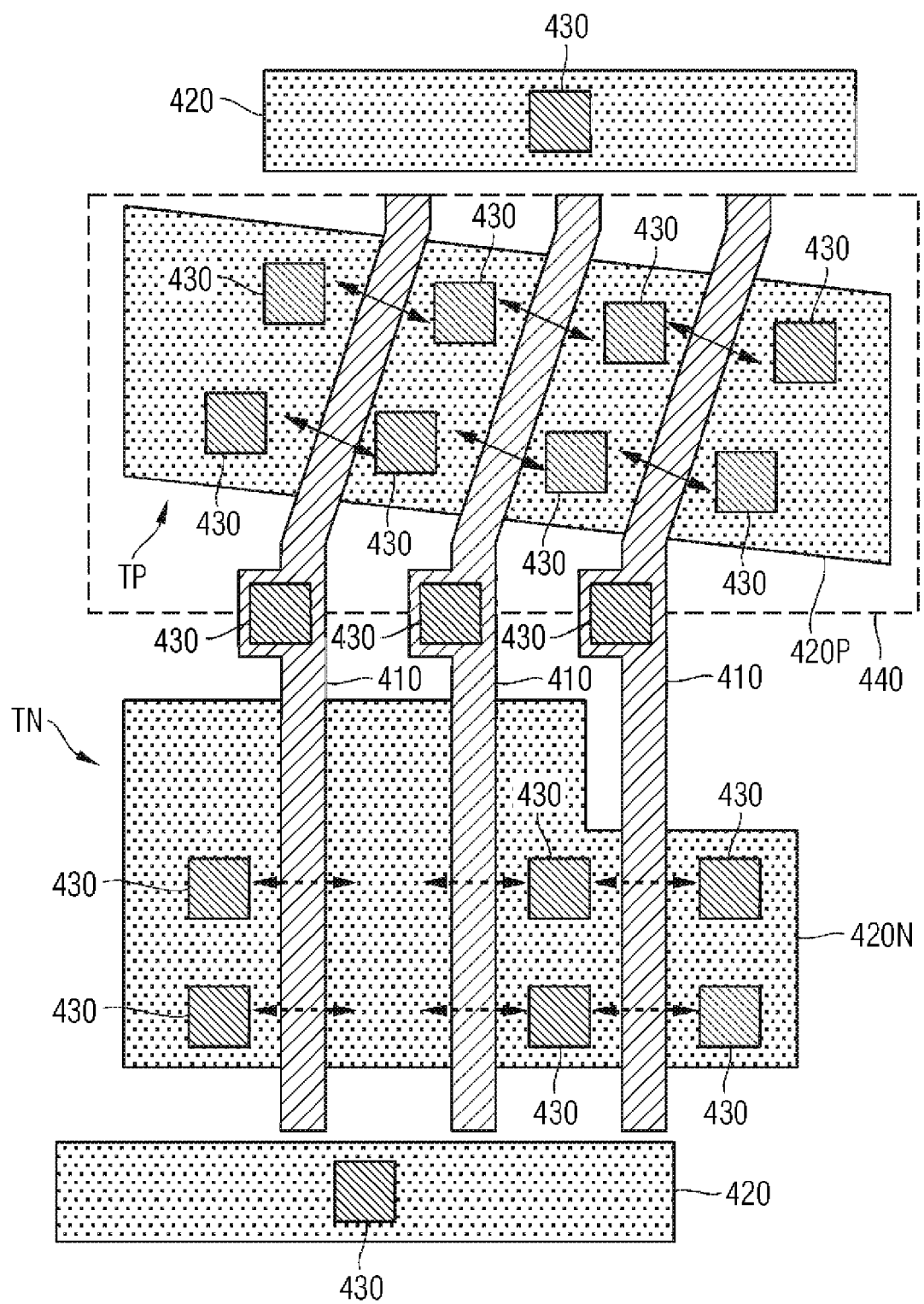

FIG. 30 schematically represents another illustrative device layout of a logic cell in a semiconductor device. The device layout of FIG. 30 generally corresponds to that of FIG. 28, and similar components have been designated with the same reference signs. In the following, only the differences as compared to the device layout of FIG. 28 will be explained.

As compared to the device layout of FIG. 28, which has the channel forming portions of the active area 420P of the PMOS transistors TP extending along the horizontal direction, the device layout of FIG. 30 has the channel forming portions of the active area 420P of the PMOS transistors TP extending at an acute angle with respect to the vertical and horizontal directions, from the upper left to the lower right. Again, this may help to align the hole channels of the PMOS transistors TP with the desired direction. Further, this may modify the stress conditions of the hole channels, thereby potentially providing a further degree of freedom to control the mobility of the hole channels.

Figure 31:
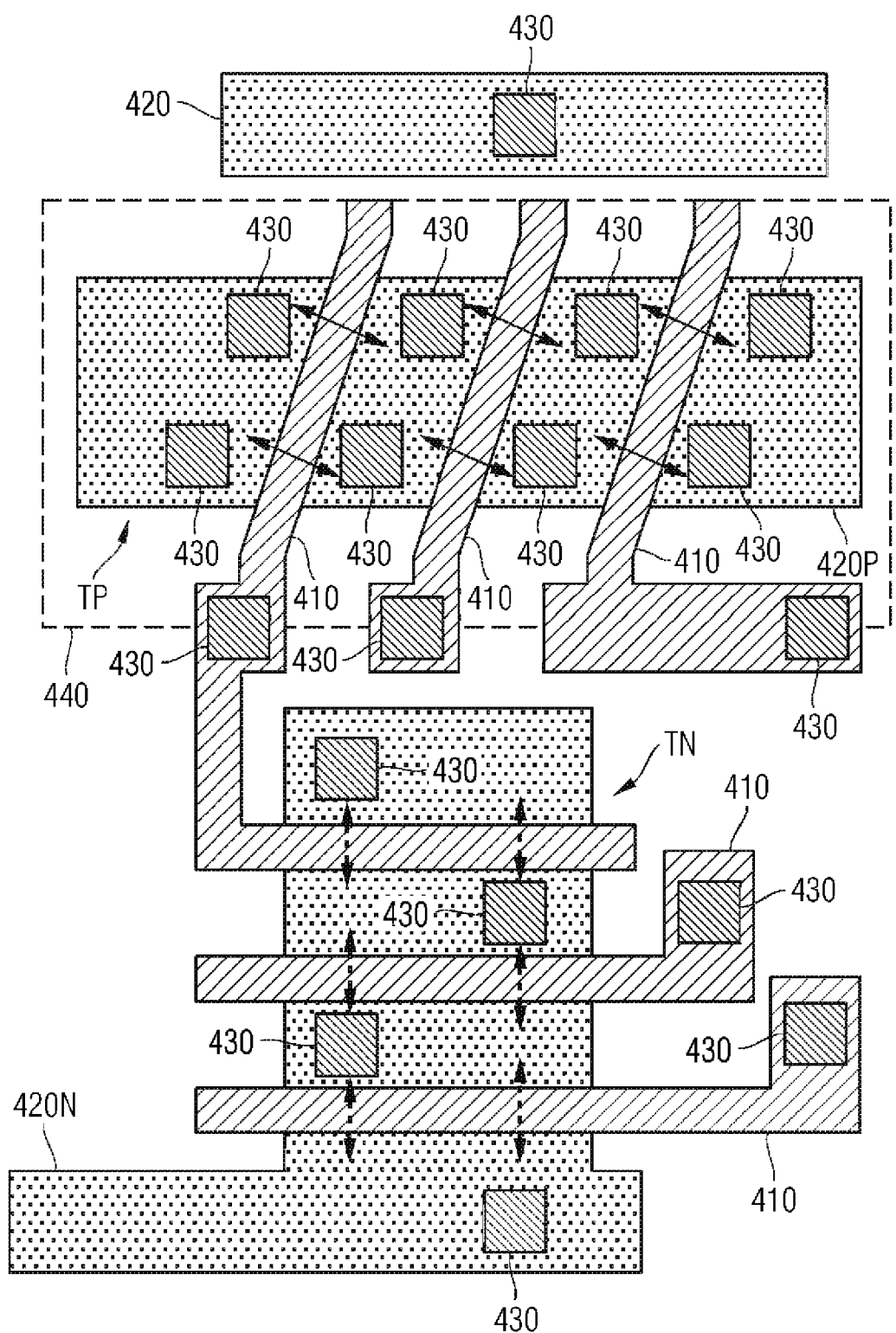

FIG. 31 schematically represents another illustrative device layout of a logic cell in a semiconductor device. The device layout of FIG. 31 generally corresponds to that of FIG. 28, and similar components have been designated with the same reference signs. In the following, only the differences as compared to the device layout of FIG. 28 will be explained.

As compared to the device layout of FIG. 28, which has the electron channels of the NMOS transistors TN aligned with the horizontal direction, the device layout of FIG. 31 has the electron channels of the NMOS transistors TN extending along the vertical direction. That is to say, as compared to the device layout of FIG. 28, the direction of the electron channels is tilted by 90 degrees. This is accomplished by having the channel forming portions of the gate conductors 410 of the NMOS transistors TN extending along the horizontal direction. FIG. 31 further illustrates that the gate conductors 410 may be provided in a non-continuous manner. In this case, a connection between different portions of the gate conductors 410 may be established by providing a connection to a respective conductive layer, e.g. by means of vias.

Figure 32:
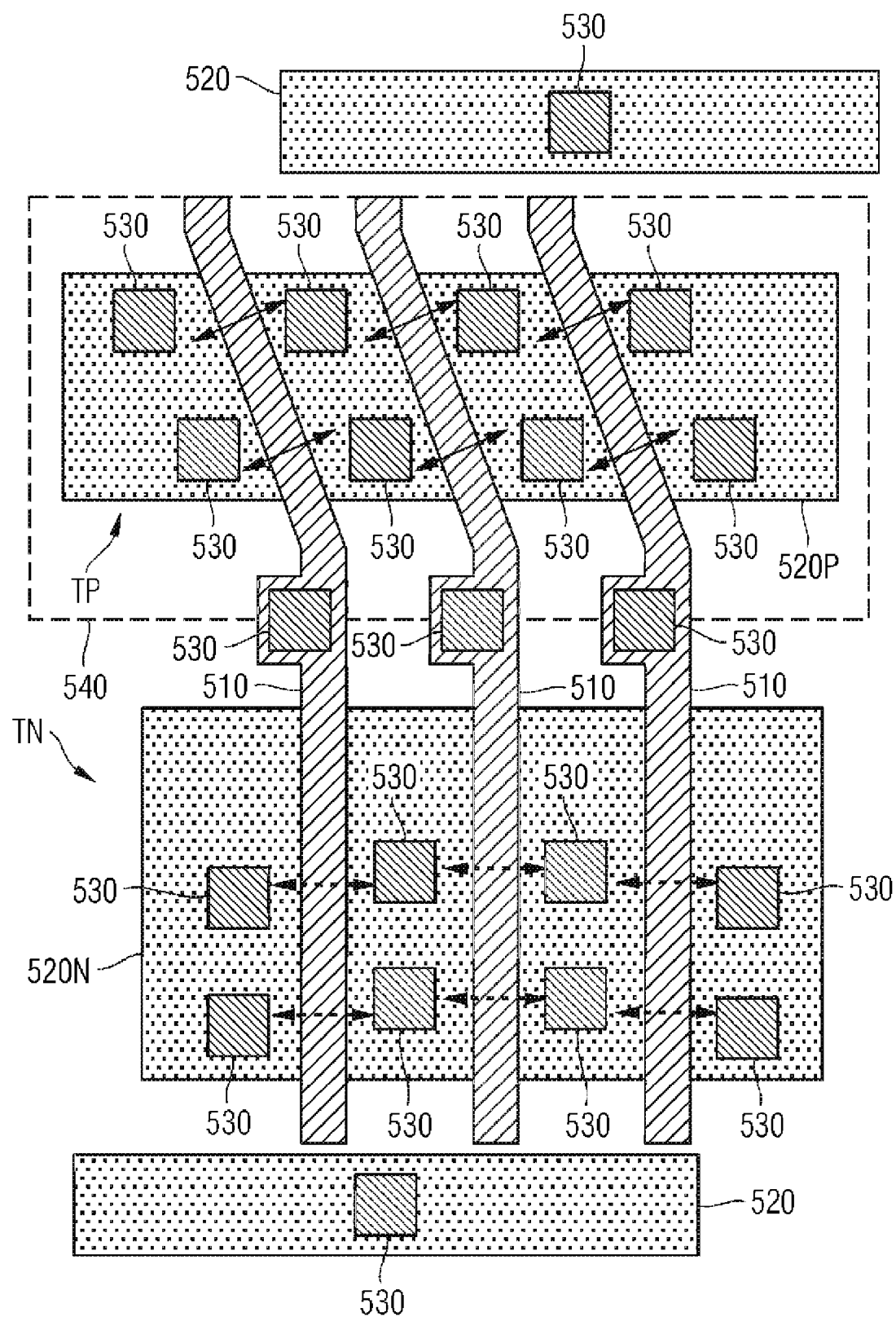
FIGS. 32-35 schematically represent various device layouts of a gate-array cell in a semiconductor device according to various illustrative embodiments.

FIG. 32 schematically represents an illustrative embodiment of a device layout of a gate array cell in a semiconductor device. The gate array cell may be used as the basis for implementing logic functions of the semiconductor device. By means of the gate array cell, a variety of logic functions may be implemented. The specific logic functions provided by the gate array cell may be controlled by applying voltages to gate electrodes. Accordingly, the gate array cell may also be referred to as a field-programmable device, such as a field-programmable gate array (FPGA), because the logic functions of the gate array cell are controlled by applying electrical fields using gate electrodes.

As illustrated in FIG. 32, the illustrative gate array cell comprises active areas 520, 520P, 520N. In the active area 520P, a plurality of PMOS transistors TP is provided. In the active area 520N, a plurality of NMOS transistors is provided. Common gate conductors 510 extend both over the active area 520P of the PMOS transistors TP and over the active area 520N of the NMOS transistors TN. Similar to FIG. 2, the direction of electron channels of the NMOS transistors TN is illustrated by dotted arrows, and the direction of hole channels of the PMOS transistors TP is illustrated by solid arrows. The gate conductors 510 are electrically isolated from the active areas 520P, 520N by means of a gate oxide (not illustrated). A plurality of contacts 530 is provided so as to realize electrical connections, e.g. by vias provided with respect to a conducted layer.

The active area 520P of the PMOS transistors TP is provided in an n-type well of the p-type semiconductor substrate. In other embodiments, the active area 520N of the NMOS transistors TN may be provided in a p-type well of an n-type substrate.

As further illustrated in FIG. 32, the active areas 520, 520P, 520N are generally aligned with the vertical and horizontal directions of the figure. According to some embodiments, the semiconductor device may be provided on a {100}-type surface of the semiconductor substrate, and the vertical direction of the Figure may correspond to a <110>-type direction on the {100}-type surface. According to other embodiments, other surface orientations and substrate rotations may be provided.

As further illustrated in FIG. 32, channel forming portions of the gate conductors 510 of the NMOS transistors TN extend along the vertical direction. Accordingly, the direction of the electron channels in the NMOS transistors TN extends along the horizontal direction, which according to the above-mentioned surface orientation and substrate rotation corresponds to a <110>-type direction. Channel forming portions of the gate conductors 510 of the PMOS transistors TP extend at an acute angle with respect to the vertical and horizontal directions, from the lower right to the upper left. Accordingly, the direction of the hole channels of the PMOS transistors TP extends at an acute angle with respect to the vertical and horizontal directions and with respect to the direction of the electron channels of the NMOS transistors TN, from the lower left to the upper right. According to the above-mentioned surface orientation and substrate rotation, the direction of the hole channels is rotated from the <110>-type direction toward the <100>-type direction, thereby potentially providing a high mobility of both the electron channels and the hole channels.

Figure 33:
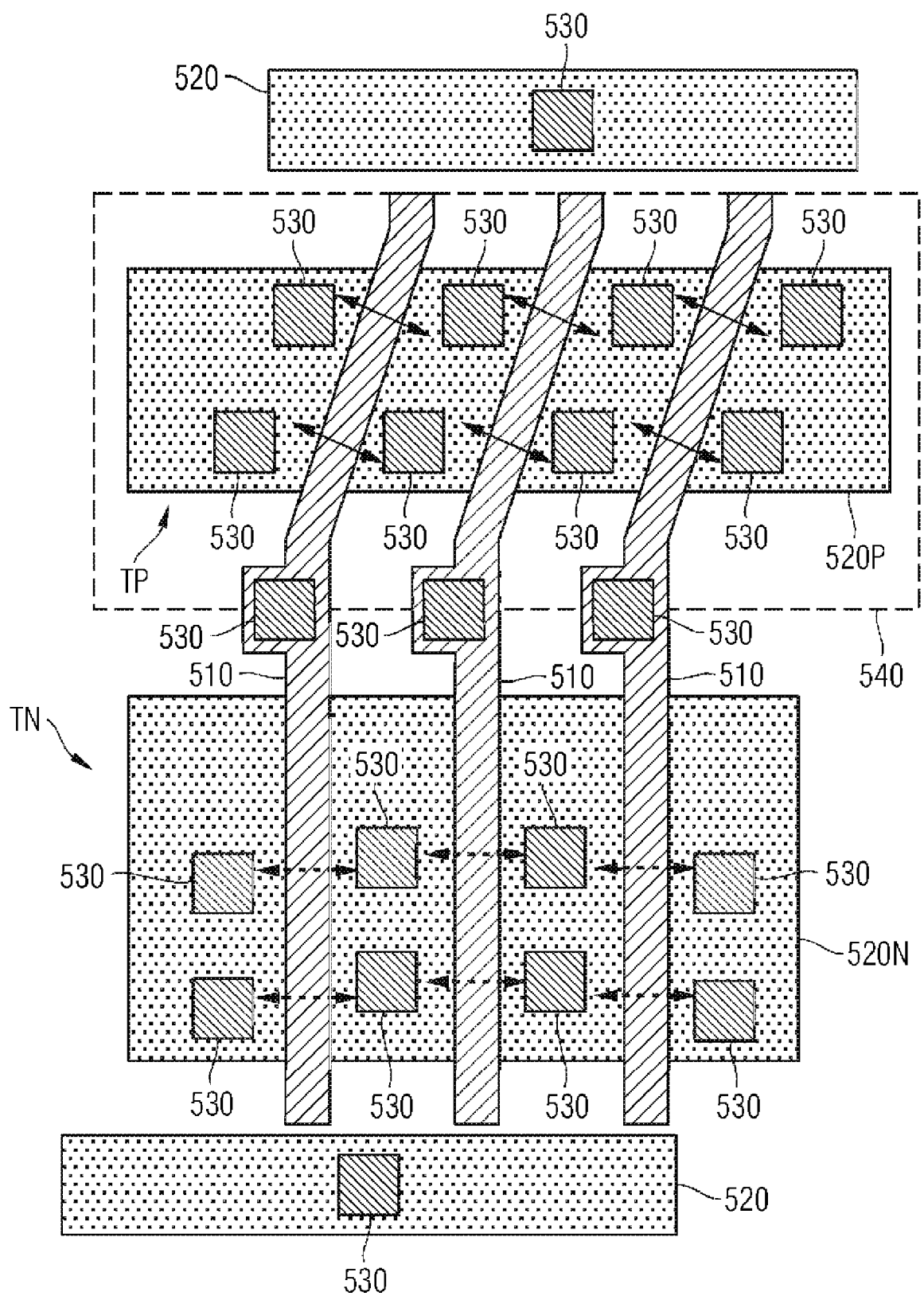

FIG. 33 schematically represents another illustrative device layout of a gate array cell in a semiconductor device. The device layout of FIG. 33 generally corresponds to that of FIG. 32 and similar components have been designated with the same reference signs. In the following, only the differences as compared to the device layout of FIG. 32 will be explained.

As compared to the device layout of FIG. 32, the device layout of FIG. 33 has the channel forming portions of the gate conductors 510 in the PMOS transistors TP extending at an acute angle with respect to the vertical and horizontal directions, from the lower left to the upper right. Accordingly, the direction of the hole channels of the PMOS transistors TP extends at an acute angle with respect to the vertical and horizontal directions, from the upper left to the lower right.

Figure 34:
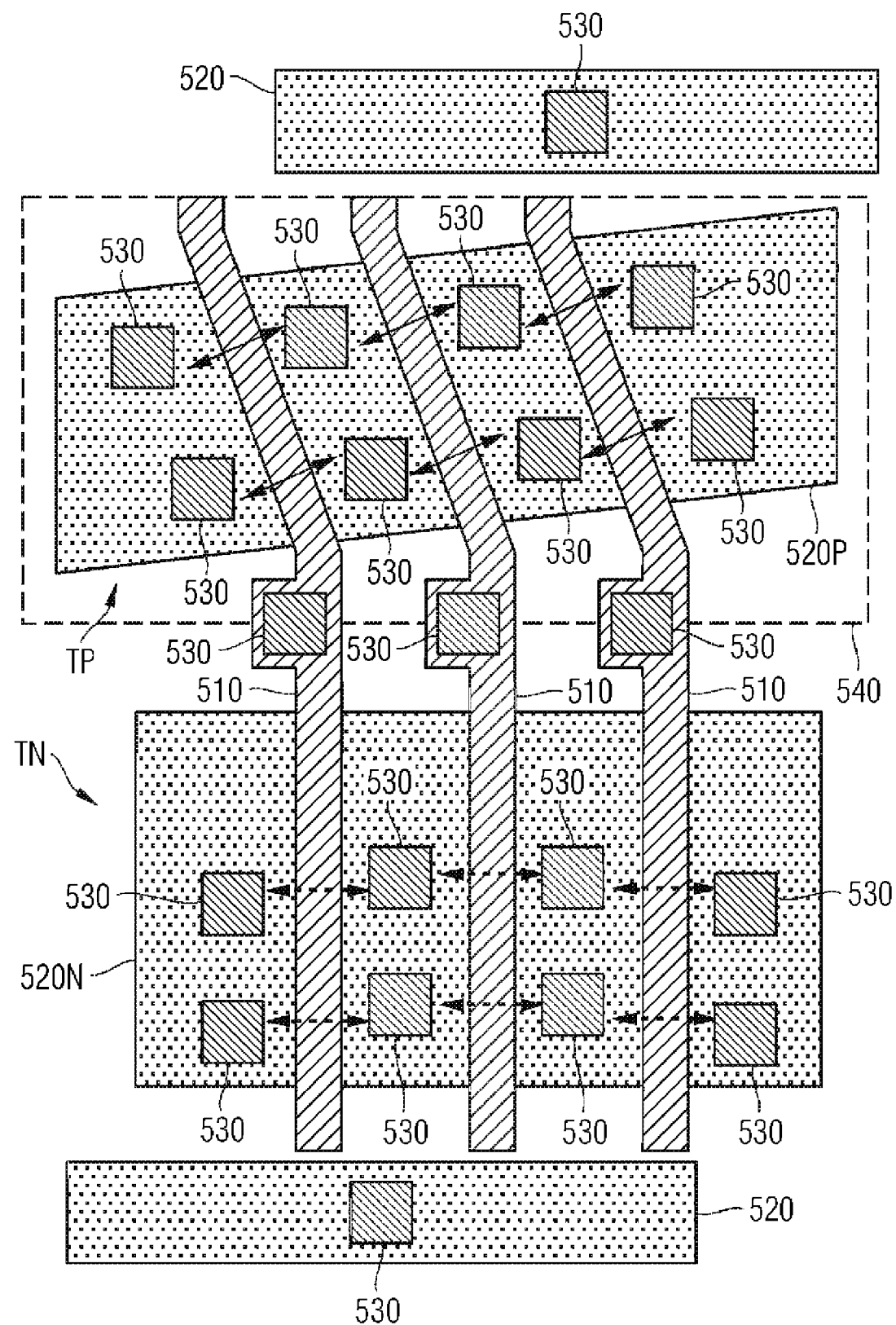

FIG. 34 schematically represents another illustrative device layout of a gate array cell in a semiconductor device. The device layout of FIG. 33 generally corresponds to that of FIG. 32, and similar components have been designated with the same reference signs. In the following, only the differences as compared to the device layout of FIG. 32 will be explained.

As compared to the device layout of FIG. 32, which has the channel forming portions of the active area 520P extending along the horizontal direction, the device layout of FIG. 34 has the channel forming portions of the active area 520P of the PMOS transistors TP extending at an acute angle with respect to the vertical and horizontal directions, from the lower left to the upper right. On the one hand, this may help to align the hole channels of the PMOS transistors TP with the desired direction. On the other hand, this may modify the stress conditions of the hole channels of the PMOS transistors TP, thereby potentially providing a further degree of freedom for controlling the mobility of the hole channels.

Figure 35:
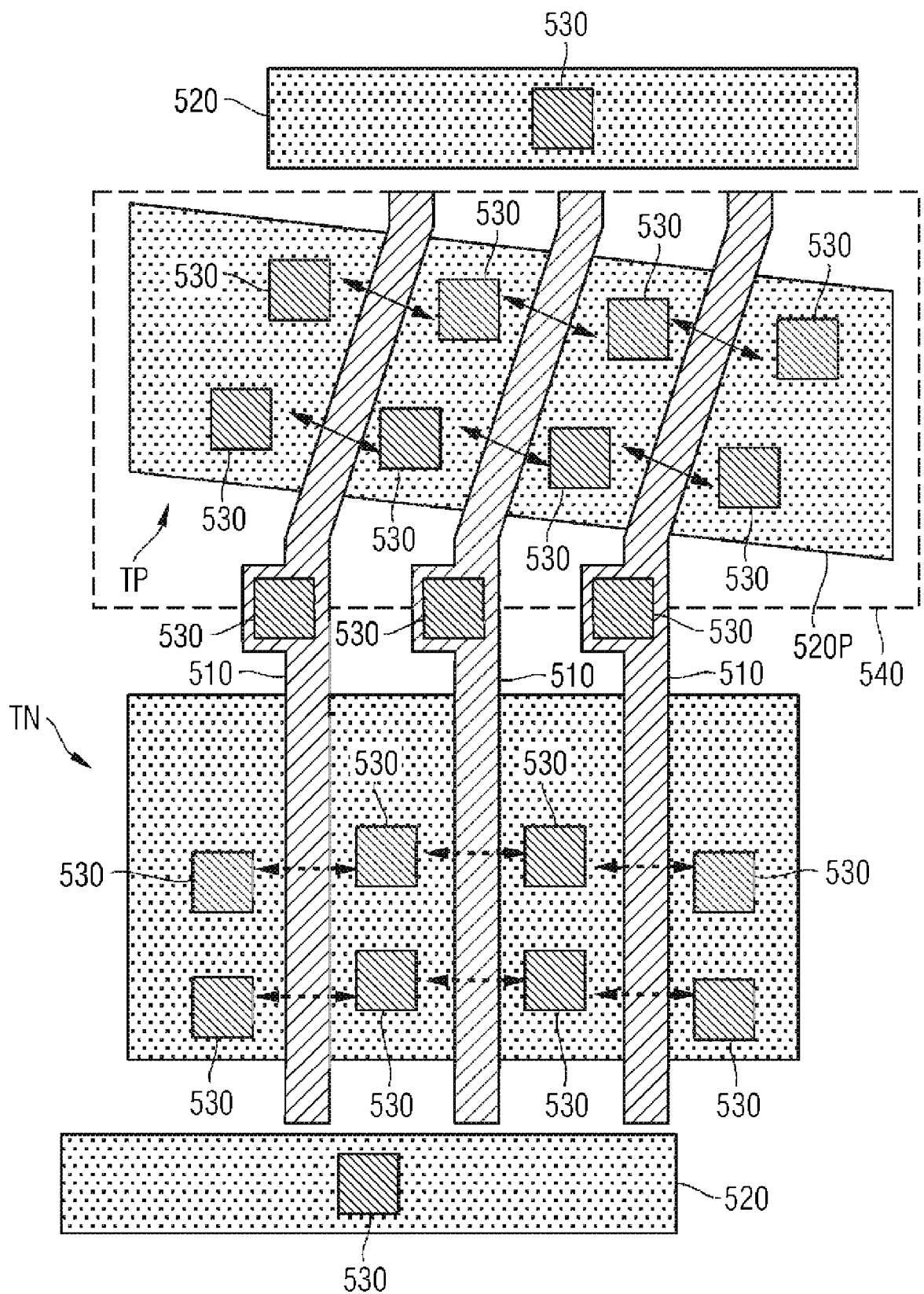

FIG. 35 schematically represents another illustrative device layout of a gate array cell in a semiconductor device. The device layout of FIG. 35 generally corresponds to that of FIG. 33, and similar components have been designated with the same reference signs. In the following, only the differences as compared to the device layout of FIG. 33 will be explained.

As compared to the device layout of FIG. 33, which has the channel forming portions of the active area 520P of the PMOS transistors TP extending along the horizontal direction, the device layout of FIG. 35 has the channel forming portions of the active area 520P of the PMOS transistors TP extending at an acute angle with respect to the vertical and horizontal directions, from the upper left to the lower right. Again, this may help to provide the hole channels of the PMOS transistors TP with the desired direction. Further, this may modify the stress conditions of the hole channels, thereby potentially providing a further degree of freedom to control the mobility of the hole channels.

It is to be understood that the foregoing description of specific embodiments of the invention is merely illustrative and not intended to limit the scope of the invention. For example, features of the different embodiments could be combined with each other. For example, a semiconductor device may be provided that includes SRAM cells, a ROM array, logic cells, and/or gate array cells according to one or more of the above embodiments.

Further, it is to be understood that the illustrated device types are merely exemplary. Other embodiments may provide other types of memory devices, e.g. using a dual-port SRAM cell, a multiport SRAM cell or a three-transistor SRAM cell. According to further embodiments, mixed-signal devices or analog devices may be provided instead of purely digital devices. Still further embodiments may provide peripheral circuit structures of memories such as sense amplifiers.

Also, it is to be understood that the geometry of the device layouts may be modified, and dimensions may be scaled, according to the specific requirements of the implementation. Further, it is to be understood that a plurality of different orientations may be provided for electron channels of NMOS devices and hole channels of PMOS devices in the same semiconductor device. In addition, as compared to the above-described embodiments of logic cells and gate array cells, these could also be implemented with rotated electron channels of the NMOS devices rather than with rotated hole channels of the PMOS devices.

The invention claimed is:

1. A method, comprising:
    forming an NMOS device on a substrate, wherein an electron channel of the NMOS device is aligned with a first direction; and
    forming a PMOS device on the substrate, wherein a hole channel of the PMOS device is aligned with a different second direction forming an acute angle with respect to the first direction,
    wherein the substrate comprises a crystal, the method further comprising forming the NMOS device and the PMOS device on a {100}-type surface of the substrate,
    wherein the first direction corresponds to a <110>-type crystal direction, and
    wherein the second direction corresponds to a <100>-type crystal direction.

2. The method of claim 1, wherein forming the NMOS device comprises forming the NMOS device in a first active area of the semiconductor substrate, forming the PMOS device comprises forming the PMOS device in a second active area of the semiconductor substrate, and the second active area is electrically isolated from the first active area.

3. The method of claim 2, wherein a channel forming portion of the first active area and a channel forming portion of the second active area are rotated with respect to each other so as to provide the angle between the first direction and the second direction.

4. The method of claim 1, wherein a channel forming portion of a gate conductor of said NMOS device and a channel forming portion of a gate conductor of said PMOS device are rotated with respect to each other so as to provide the angle between the first direction and the second direction.

5. The method of claim 1, further comprising orienting the semiconductor substrate to set the first direction and the second direction with respect to a crystal direction of the semiconductor substrate.

6. The method of claim 1, further comprising determining the angle according to a type of the semiconductor device.

7. The method of claim 1, further comprising determining the angle according to a function of at least one of the NMOS device and the PMOS device.

8. A semiconductor device, comprising:
    a substrate;
    an NMOS device formed on the substrate and having an electron channel aligned with a first direction; and
    a PMOS device formed on the substrate and having a hole channel aligned with a different second direction forming an acute angle with respect to the first direction,
    wherein the substrate comprises a crystal, and the NMOS device and the PMOS device are formed on a {100}-type surface of the substrate,
    wherein the first direction is a <110>-type crystal direction, and
    wherein the second direction is a <100>-type crystal direction.

9. The semiconductor device of claim 8, wherein the NMOS device is provided in a first active area of the semiconductor substrate, and the PMOS device is provided in a second active area of the semiconductor substrate, the second active area being electrically isolated from the first active area.

10. The semiconductor device according to claim 9, wherein a channel forming portion of said first active area and a channel forming portion of said second active area are rotated with respect to each other so as to provide the angle between the first direction and the second direction.

11. The semiconductor device of claim 8, wherein the NMOS device and the PMOS device are each rotated with respect to the semiconductor substrate to set the first direction and the second direction with respect to a crystal direction of the semiconductor substrate.

12. The semiconductor device of claim 8, wherein said semiconductor device comprises a logic circuit that comprises the NMOS device and the PMOS device.

13. A semiconductor device, comprising:
    a semiconductor substrate;
    a first field-effect transistor formed on the semiconductor substrate and having an n-type channel aligned with a first direction; and
    a second field-effect transistor formed on the semiconductor substrate and having a p-type channel aligned with a different second direction forming an acute angle with respect to the first direction, wherein the semiconductor substrate comprises a crystal, and the first field-effect transistor and the second field-effect transistor are formed on a {100}-type surface of the semiconductor substrate, wherein the first direction is a <110>-type crystal direction, and wherein the second direction is a <100>-type crystal direction.

14. The semiconductor device of claim 13, wherein the first and second field-effect transistors are each a MOS device.

15. The method of claim 1, wherein forming the NMOS device and forming the PMOS device comprises forming the NMOS device and the PMOS device using a planar CMOS process.

16. The semiconductor device of claim 8, wherein the NMOS device and the PMOS device are formed using a planar CMOS process.

17. The semiconductor device of claim 13, wherein the first field-effect transistor and the second field-effect transistor are formed using a planar CMOS process.

* * * * *